(12) United States Patent
Kim et al.

(10) Patent No.: US 8,986,554 B2
(45) Date of Patent: Mar. 24, 2015

(54) METHOD OF FORMING PATTERNS

(71) Applicant: Samsung Electronics Co., Ltd., Gyeonggi-do (KR)

(72) Inventors: Eun-sung Kim, Seoul (KR); Kyoung-seon Kim, Gyeonggi-do (KR); Jae-woo Nam, Seoul (KR); Chul-ho Shin, Gyeonggi-do (KR); Shi-young Yi, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/719,995

(22) Filed: Dec. 19, 2012

(65) Prior Publication Data

US 2013/0295772 A1  Nov. 7, 2013

(30) Foreign Application Priority Data

May 7, 2012 (KR) .......................... 10-2012-0048321

(51) Int. Cl.
| | |
|---|---|
| H01B 13/00 | (2006.01) |
| H01L 21/308 | (2006.01) |
| G03F 1/00 | (2012.01) |
| H01L 21/027 | (2006.01) |
| H01L 21/033 | (2006.01) |

(52) U.S. Cl.
CPC ............... *H01L 21/308* (2013.01); *G03F 1/00* (2013.01); *H01L 21/0273* (2013.01); *H01L 21/0274* (2013.01); *H01L 21/0337* (2013.01)
USPC ................ 216/17; 216/41; 216/49; 430/311; 430/394

(58) Field of Classification Search
USPC ................................................. 430/311, 394
See application file for complete search history.

(56) References Cited

U.S. PATENT DOCUMENTS

| | | | |
|---|---|---|---|
| 7,595,267 B2 | 9/2009 | Jung | |
| 7,855,408 B2 | 12/2010 | Lee et al. | |
| 8,034,544 B2 | 10/2011 | Yune | |
| 8,114,306 B2 | 2/2012 | Cheng et al. | |
| 8,415,089 B1 * | 4/2013 | Gupta et al. | 430/311 |
| 2010/0055626 A1 | 3/2010 | Endou et al. | |
| 2011/0059407 A1 * | 3/2011 | Lin et al. | 430/326 |
| 2011/0124196 A1 | 5/2011 | Lee | |

FOREIGN PATENT DOCUMENTS

KR  1020090070031  7/2009

OTHER PUBLICATIONS

Lee et al, An analysis of double exposure lithography options, 2008, SPIE, Optical Microlithography vol. 6924, p. 69242A-1 through 69242A-12.*

* cited by examiner

*Primary Examiner* — Binh X Tran
*Assistant Examiner* — David Cathey, Jr.
(74) *Attorney, Agent, or Firm* — F. Chau & Associates, LLC

(57) ABSTRACT

A method of forming patterns includes forming a photoresist film on a substrate. The photoresist film is exposed with a first dose of light to form a first area and a second area in the photoresist film. A first hole and a second hole are formed by removing the first area and the second area with a first developer. The photoresist film is re-exposed with a second dose of the light to form a third area in the photoresist film between the first hole and the second hole. A third hole is formed between the first hole and the second hole by removing the third area with a second developer.

20 Claims, 28 Drawing Sheets

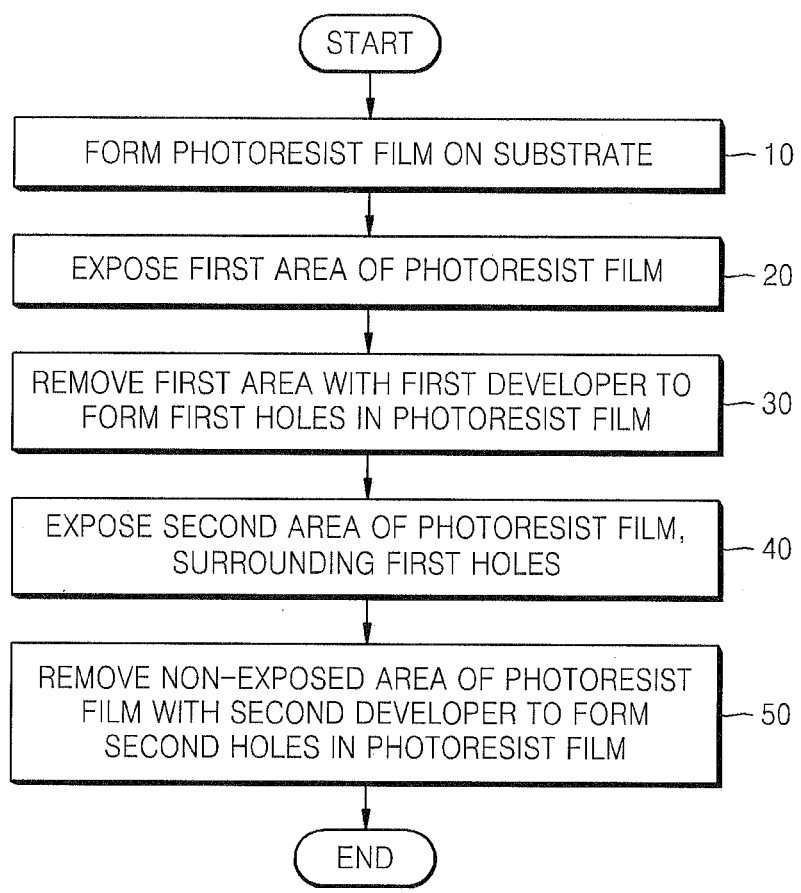

METHOD OF FORMING PATTERNS

CROSS-REFERENCE TO RELATED APPLICATION

This application claims priority under 35 U.S.C. §119 to Korean Patent Application No. 10-2012-0048321, filed on May 7, 2012, in the Korean Intellectual Property Office, the disclosure of which is incorporated by reference herein in its entirety.

TECHNICAL FIELD

The inventive concept relates to a method of forming patterns, and more particularly, a method of forming patterns with a fine pitch.

DESCRIPTION OF THE RELATED ART

Various exposure technologies and patterning technologies have been suggested for forming fine patterns in a process of fabricating semiconductor devices. As semiconductor device dimensions shrink, photolithographic processes need to use a shorter exposure wavelength in forming fine patterns having a fine pitch in a limited area.

SUMMARY

According to an exemplary embodiment of the inventive concept, a method of forming patterns comprises forming a photoresist film on a substrate. The photoresist film is exposed with a first dose of light to form a first area and a second area in the photoresist film. A first hole and a second hole are formed by removing the first area and the second area with a first developer. The photoresist film is re-exposed with a second dose of the light to form a third area in the photoresist film between the first hole and the second hole. A third hole is formed between the first hole and the second hole by removing the third area with a second developer.

According to an exemplary embodiment of the inventive concept, a method of manufacturing a semiconductor device comprises a step of forming a photoresist film on a substrate. A photomask including at least two light transmitting areas is aligned with the photoresist film. A first dose of light is irradiated through the photomask to form at least two areas in the photoresist film. Each of at least two areas are positioned below each of at least two light transmitting areas and each of at least two areas are smaller than each of the at least two transmitting areas. At least two holes are formed by removing the at least two areas from the photoresist with a first developer. The photomask is re-aligned with the photoresist including the at least two holes. A second dose of the light through the photomask is irradiated to form a third area in the photoresist. The third area is positioned between the at least two holes in the photoresist. A third hole is formed by removing the third area from the photoresist film with a second developer.

BRIEF DESCRIPTION OF THE DRAWINGS

These and other features of the inventive concept will become more apparent by describing in detail exemplary embodiments thereof with reference to the accompanying drawings of which:

FIG. 1 is a flowchart illustrating a method of forming patterns according to an exemplary embodiment of the present inventive concept;

FIGS. 2A and 2B to 9A and 9B are plan views and cross-sectional views for explaining a method of forming patterns according to an exemplary embodiment of the present inventive concept, wherein FIG. 2B to FIG. 9B are cross-sectional views of lines B-B' of FIG. 2A to FIG. 9A, respectively;

FIGS. 12A and 12B to 15A and 15B are plan views and cross-sectional views for explaining a method of forming patterns according to an exemplary embodiment of the present inventive concept, wherein FIG. 12B, FIG. 13B, FIG. 14B, and FIG. 15B are cross-sectional views of lines B-B' of FIG. 12A, FIG. 13A, FIG. 14A, and FIG. 15A, respectively;

FIGS. 17A and 17B to 22A and 22B are plan views and cross-sectional views for explaining a method of fanning patterns according to an exemplary embodiment of the present inventive concept, wherein FIG. 17B to FIG. 22B are cross-sectional views of lines B-B' of FIG. 17A to FIG. 22A, respectively; and FIGS. 23A and 23B to 28A and 28B are plan views and cross-sectional views for explaining a method of forming patterns according to an exemplary embodiment of the present inventive concept, wherein FIG. 23B to FIG. 28B are cross-sectional views of lines B-B' of FIG. 23A to FIG. 28A, respectively.

DETAILED DESCRIPTION OF THE EMBODIMENTS

Figure 2A:
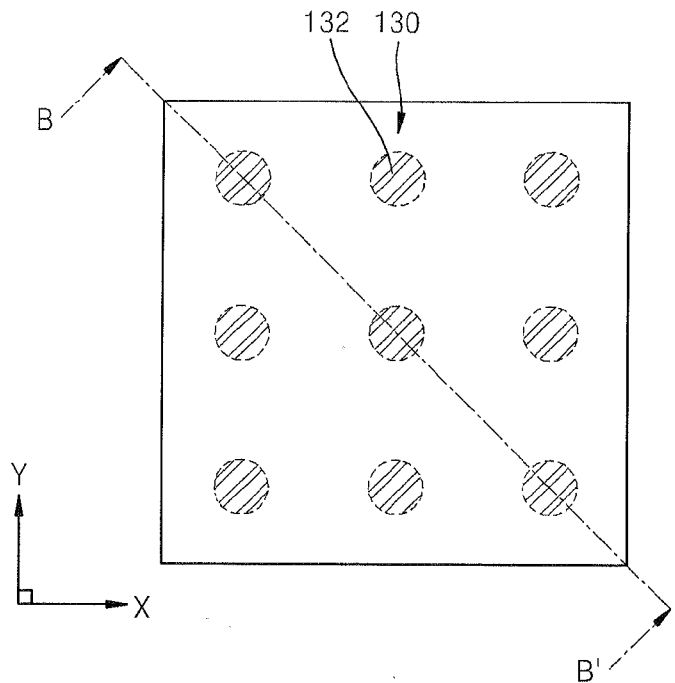

Exemplary embodiments of the inventive concept will be described below in more detail with reference to the accompanying drawings. However, the inventive concept may be embodied in different forms and should not be construed as limited to the embodiments set forth herein. In the drawings, the thickness of layers and regions may be exaggerated for clarity. Like reference numerals may refer to the like elements throughout the specification and drawings.

FIG. 1 is a flowchart illustrating a method of forming patterns, according to an exemplary embodiment of the present inventive concept.

Referring to FIG. 1, in operation 10, a photoresist film is formed on a substrate.

In some exemplary embodiments, the photoresist film may include a positive-type photoresist. For example, the photoresist film may include a resin including an acid-labile protecting group and a chemically amplified photo-acid generator (PAG) photoresist.

In operation 20, a first exposing operation is performed to expose at least one first area of the photoresist film by using a first dose. The first dose may depend on the size of a first hole formed in the photoresist film in the following operation 30. The smaller target size the first hole has, the smaller set value the first dose may have. In addition, the greater target size the first hole has, the greater set value the first dose may have.

The first exposing operation may be performed by using a photomask having at least one light-transmissible area. In an exemplary embodiment, the photomask may have a plurality of hole-shaped light-transmissible areas that are arranged at a density lower than that of a plurality of final hole patterns with a pitch greater than a minimum pitch of the final hole patterns.

After the first exposing operation, polarity of the photoresist film may be increased due acid generated by the exposure.

In operation 30, the at least one first area which has been exposed in operation 20 is removed with a first developer to form at least one first hole in the photoresist film.

The first developer may include a positive tone developer that may be used to selectively remove a portion that has a polarity increased due to the exposing on the photoresist film, in other words, a portion of the photoresist film which has a predetermined level of an exposure. In an exemplary embodiment, the first developer may include an aqueous alkali solution.

The at least one first hole is arranged at a density smaller than that of a plurality of final hole patterns with a pitch greater than a minimum pitch of the final hole patterns. The photoresist film may have a plurality of first holes, and the first holes may be arranged in a matrix form.

In operation 40, a second exposing operation is performed to expose at least one second area of the photoresist film which surrounds the at least one first hole by using a second dose.

In the second exposing operation, the second dose may depend on the size of a second hole that is to be formed in the photoresist film in the following operation 50. The smaller target size the second hole has, the smaller set value the second dose may have. In addition, the greater target size the second hole has, the greater set value the second dose may have. The second dose may be greater than the first dose supplied in the first exposing operation in operation 20. However, the present inventive concept is not limited thereto. For example, the second dose may be identical to or smaller than the first dose.

The second exposing operation may be performed by using the same photomask as used in the first exposing operation in operation 20. In an exemplary embodiment, an alignment of the substrate and the photomask in the first exposing operation may be identical to an alignment of the substrate and the photomask in the second exposing operation.

After the second exposing operation, a polarity of the second area of the photoresist film may be increased due to acid generated by the exposure. The second area may define at least one non-exposed area in the photoresist film.

In operation 50, the non-exposed area of the photoresist film is removed with a second developer to form at least one second hole in the photoresist film.

The second developer may include a negative tone developer that is used to selectively remove the non-exposed area of the photoresist film, or a portion that has such a small exposure amount that a polarity change does not substantially occur in the photoresist film. In an exemplary embodiment, the first developer may include an organic solvent. After the at least one second hole is formed, only the second area of the photoresist film may remain on the substrate.

The at least one second hole may be formed spaced from the at least one first hole. The at least one second hole may be arranged at a density lower than that of a plurality of final hole patterns.

The photoresist film may have a plurality of first holes and a plurality of second holes. The first holes may be arranged in a matrix form, and the second holes each may be arranged between two neighboring first holes in a direction identical to a diagonal direction of the matrix. A minimum distance between the first holes and the second holes may be smaller than a minimum distance between the first holes.

In the photoresist film, a plurality of holes including the first holes and the second holes may be arranged in a honeycomb.

FIGS. 2A and 2B to 9A and 9B are plan views and cross-sectional views for explaining a method of forming patterns, according to an exemplary embodiment of the present inventive concept, wherein FIG. 2B to FIG. 9B are cross-sectional views of lines B-B' of FIG. 2A to FIG. 9A, respectively.

Figure 2B:
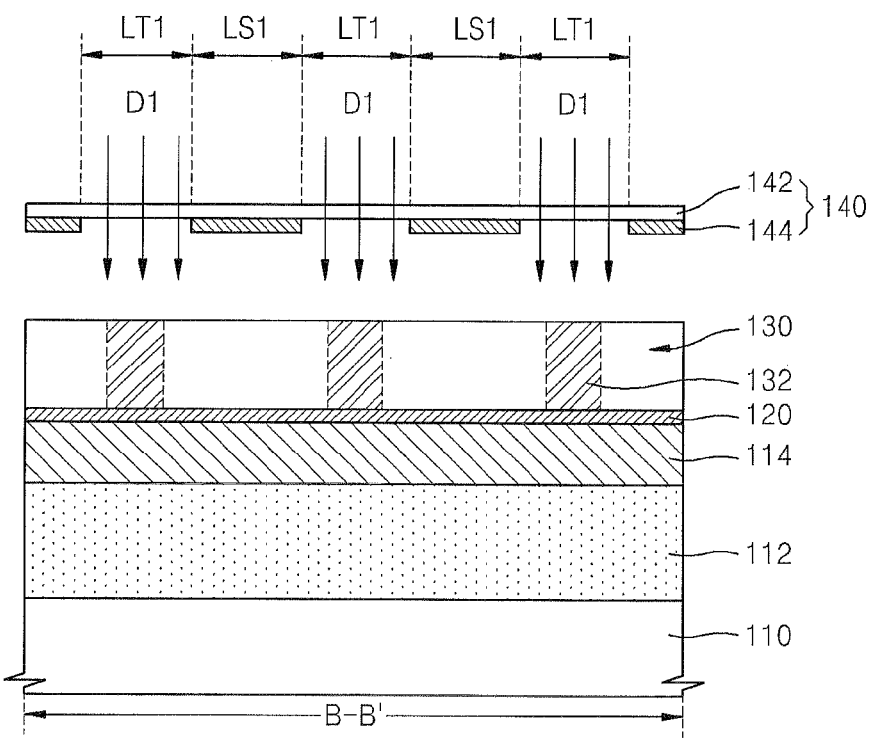

Referring to FIGS. 2A and 2B, a to-be-etched film 112 and a hard mask layer 114 are sequentially formed on a substrate 110. In addition, an anti-reflective coating film 120 and a photoresist film 130 are sequentially formed on the hard mask layer 114.

The substrate 110 may be a semiconductor substrate. In an exemplary embodiment, the substrate 110 may include silicon (Si), for example, crystalline Si, polycrystalline Si, or amorphous Si. In an exemplary embodiment, the substrate 110 may include a compound semiconductor, such as Ge, SiGe, SiC, GaAs, InAs, or InP. In an exemplary embodiment, the substrate 110 may have a silicon on insulator (SOI) structure. The substrate 110 may include a conductive region, for example, an impurity-doped well, or an impurity-doped region. In addition, the substrate 110 may have various isolation structures including a shallow trench isolation (STI) structure.

According to an exemplary embodiment of the inventive concept, the to-be-etched film 112 may be a target layer where desired patterns are formed using the photoresist film 130. The target layer may include an insulating film or a conductive film. For example, the to-be-etched film 112 may include an oxide film, a nitride film, an oxynitride film, a carbide film, a metal film, or a semiconductor film. In an exemplary embodiment, the target layer may be the substrate 110 where the to-be-etched film 112 need not be present.

The hard mask layer 114 may be formed of a layer having etch selectivity with respect to the to-be-etched film 112. For example, the hard mask layer 114 may be an oxide film, a nitride film, a SiCN film, a polysilicon film, an amorphous carbon layer (ACL), or a carbon-containing film.

The anti-reflective coating film 120 may be formed of various materials according to a light source. For a KrF excimer laser, an ArF excimer laser, or any other light source, the anti-reflective coating film 120 may include an organic anti-reflective coating (ARC) material. The anti-reflective coating film 120 may include an ARC material that is used in dry lithography operation, or an ARC material that is used in immersion lithography operation. For example, the anti-reflective coating film 120 may include an organic ARC material selected from product name "NCA" series and "NCST" series (product of Nissan Chemical Industries, Ltd.), product name "XP" series (product of Rohm and Haas Electronic Materials (RHEM)), and product name "SNSA" series (product of Shin-Etsu Chemical Co.).

In an exemplary embodiment, the anti-reflective coating film 120 may include a material that does not dissolve in a basic aqueous solution. For example, the anti-reflective coating film 120 may include an inorganic material including titanium, titanium dioxide, titanium nitride, chromium oxide, carbon, silicon nitride, silicon oxynitride, amorphous silicon, or a combination thereof.

In an exemplary embodiment, the anti-reflective coating film 120 may include a material that is dissolved in a basic aqueous solution. For example, the anti-reflective coating film 120 may include an organic ARC material including a polymer including a chromophore group, a cross-linker that reacts with an acid to be cross-linked with the polymer, a photo-acid generator (PAG), a thermal-acid generator (TAG), and a solvent. For example, the polymer may include polyhydroxystyrene (PHS) having a chromophore group. The chromophore group may include, for example, a $C_2$ to $C_{10}$ alkyl ester group that is substituted with anthracene, and a $C_2$ to $C_{10}$ azo group. The cross-linker may include a $C_4$ to $C_{50}$ hydrocarbon compound having two or more double bonds at its terminal. In an exemplary embodiment of the inventive concept, the anti-reflective coating film 120 is formed by coating an organic ARC material and then heat-treating to cross-link the organic ARC material.

According to an exemplary embodiment of the inventive concept, the anti-reflective coating film 120 may have a thickness of about 20 nm to about 150 nm. The anti-reflective coating film 120 is formed of a material that does not dissolve in a basic aqueous solution. However, the present inventive concept is not limited thereto. In an exemplary embodiment, the anti-reflective coating film 120 may be formed of a material that dissolves in a basic aqueous solution. A detailed description thereof is presented below with reference to FIGS. 12A to 15B.

The photoresist film 130 may include a positive-type photoresist. In an exemplary embodiment, the photoresist film 130 may include a resin of which polarity is increased due to an catalytic reaction of an acid. For example, the photoresist film 130 may include a resin including an acid-labile protecting group and a chemically amplified photoresist including PAG. The photoresist film 130 may include a photosensitive resin for KrF excimer laser having a wavelength of 248 nm, a photosensitive resin for ArF excimer laser having a wavelength of 193 nm, a photosensitive resin for F2 excimer laser having a wavelength of 157 nm, or an extreme ultraviolet (EUV) having a wavelength of 13.5 nm. The photoresist film 130 may be formed by spin coating.

As illustrated in FIGS. 2A and 2B, in a first exposing operation, a photomask 140 having a plurality of light shielding areas LS1 and a plurality of light-transmitting areas LT1 is aligned at a predetermined location above the substrate 110, and a first area 132 of the photoresist film 130 is exposed to a first dose D1 through the light-transmitting areas LT1 of the photomask 140.

In the first area 132 of the photoresist film 130, the acid-labile protecting group is de-protected by an acid that is generated in the first exposing operation, and polarity of the first area 132 may be stronger than other areas of the photoresist film 130. For example, the polarity may be greater than a threshold polarity to change property of the photoresist, e.g., to change the photoresist to be dissoluble in a positive tone developer. A size of the first area 132 may be reduced by relatively decreasing the first dose D1. The acid may react with the acid-labile protecting group in a catalytic reaction. For example, the first dose may be controlled such that the size of the first area 132 is smaller than that the light-transmitting area LT1.

The first exposing operation may be performed with the photomask 140 having the light-transmitting areas LT1. In an exemplary embodiment, the photomask 140 may have a plurality of hole-shaped light-transmitting areas which are arranged at a higher density than that of a plurality of holes 112H (see FIGS. 8A and 8B), which are to be finally formed.

Figure 10A:
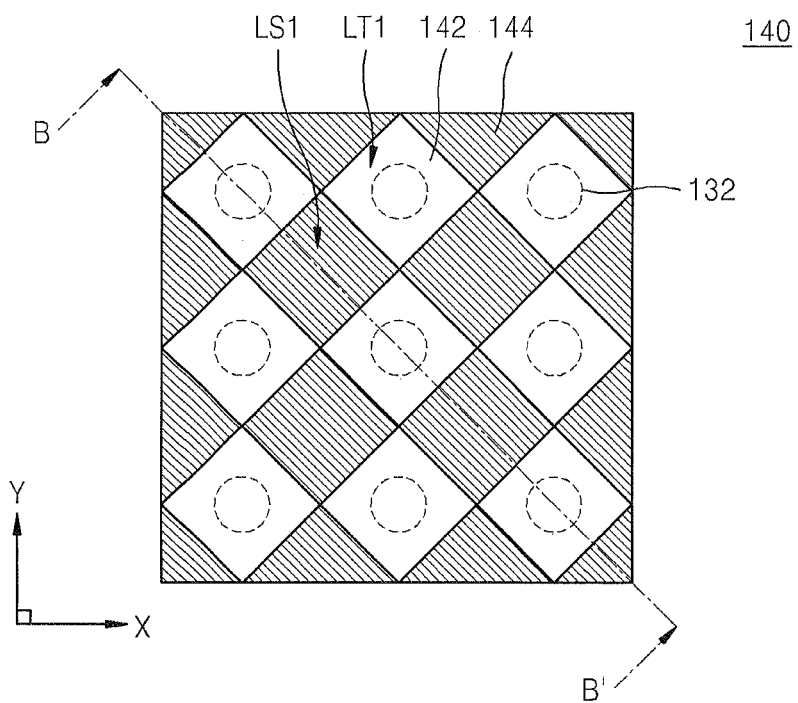
FIG. 10A is a plan view of a photomask that is used in a method of forming patterns according to an exemplary embodiment of the present inventive concept.
Figure 10B:
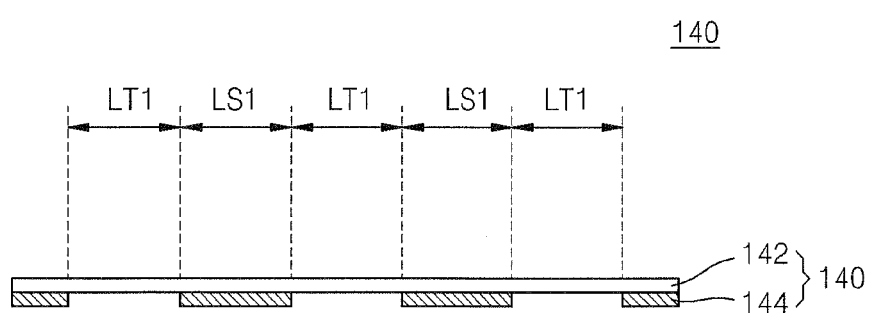
FIG. 10B is a cross-sectional view of line B-B' of FIG. 10A.

FIG. 10A is a plan view of the photomask 140, and FIG. 10B is a cross-sectional view of line B-B' of FIG. 10A. Referring to FIG. 10A and FIG. 10B, the photomask 140 may include a quartz substrate 142, and a plurality of light-shielding patterns 144 formed on the quartz substrate 142 in the light-shielding areas LS1. The light-shielding patterns 144 may be formed of a metal layer such as chromium (Cr). The light-shielding patterns 144 may define the light-transmitting areas LT1.

The light-transmitting areas LT1 are aligned in rows in a first direction (an X direction in FIG. 10A) and in columns in a second direction (a Y direction of FIG. 10A) that is perpendicular to the first direction. In the photomask 140, the light-transmitting areas LT1 are aligned in a matrix form.

Each of the light-transmitting areas LT1 may have a diamond shape having two diagonal lines that extend in parallel to the first direction (the X direction in FIG. 10A) and the second direction (the Y direction of FIG. 10A) and are perpendicular to each other.

The light-transmitting areas LT1 and the light-shielding patterns 144 may each have a diamond shape. The light-shielding patterns 144 may meet each other at their vertices.

In an exemplary embodiment of the inventive concept, an area ratio of the light-transmitting areas LT1 to the photomask 140 may be about 50%. For example, the total area of the light-transmitting areas LT1 may be substantially identical to that of the light-shielding patterns 144. In an exemplary embodiment of the inventive concept, an area of at least one of the light-transmitting areas LT1 may be identical to that of at least one of the light-shielding patterns 144.

According to an exemplary embodiment of the inventive concept, the first exposure area 132 may be formed in the photoresist film 130 using the diamond shape of the light-transmitting area LT1. For example, when light travels through the light-transmitting areas LT1 having the diamond shape, the interference pattern may form the first exposure area 132 having a hole shape below the center of the light-transmitting areas LT1. The shape of light-transmitting areas LT1 is not limited thereto, but may have various shapes according to the inventive concept. The location and size of the first exposure areas 132 may not be limited thereto, but may be changed according to the inventive concept.

Referring to FIGS. 2A and 2B, the first exposing operation may be performed using irradiation rays having various exposure wavelengths. For example, the first exposing operation may be performed using an wavelength including i-line (365 nm), KrF eximer laser (248 nm), UV (193 nm), EUV (13.5 nm), or 157 nm. In an exemplary embodiment, the first exposing operation is performed by an immersion lithography method using a wavelength of 193 nm. In an immersion lithography method, an additional layer (not shown) may be formed on the photoresist film 130 to prevent a direct contact between an immersion solution and the photoresist film 130. The additional layer may also prevent a leakage of components of the photoresist film 130 into the immersion solution.

The first exposure dose D1 of irradiation rays may be set according to the size of the first hole 132H (see FIGS. 3A and 3B) which is to be formed in the photoresist film 130 through the first exposing operation. The smaller target size the first hole 132H has, the smaller set value the first exposure dose D1 has. In addition, the greater target size the first hole 132H has, the greater set value the first exposure dose D1 has. For example, the first exposure dose D1 may be set to be about 30 mJ/cm² to form first holes 132H having a diameter of about 40 nm.

Figure 3A:
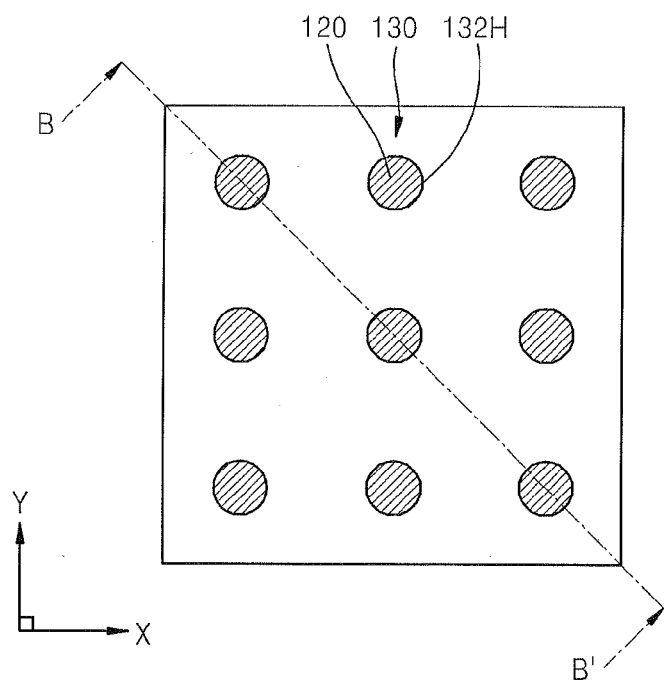
Figure 3B:
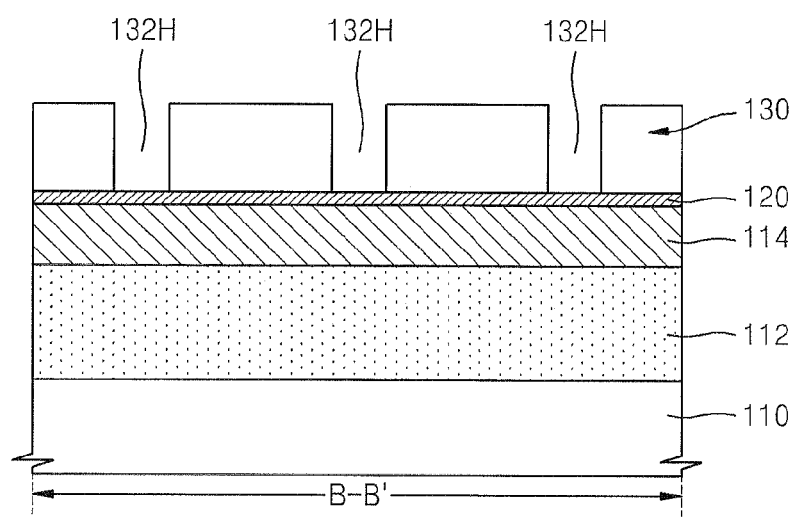

Referring to FIGS. 3A and 3B, the first exposure areas 132 of FIG. 2A are selectively removed to form the first holes 132H passing through the photoresist film 130.

The first area 132 is removed with a first developer that includes a positive tone developer. In an exemplary embodiment, the first developer includes an alkali solution. For example, the first developer may include a tetramethyl ammonium hydroxide (TMAH) aqueous solution. The TMAH aqueous solution may have a concentration of about 2 to 5 wt %.

The anti-reflective coating film 120 may be exposed by forming the first holes 132H.

Figure 8A:
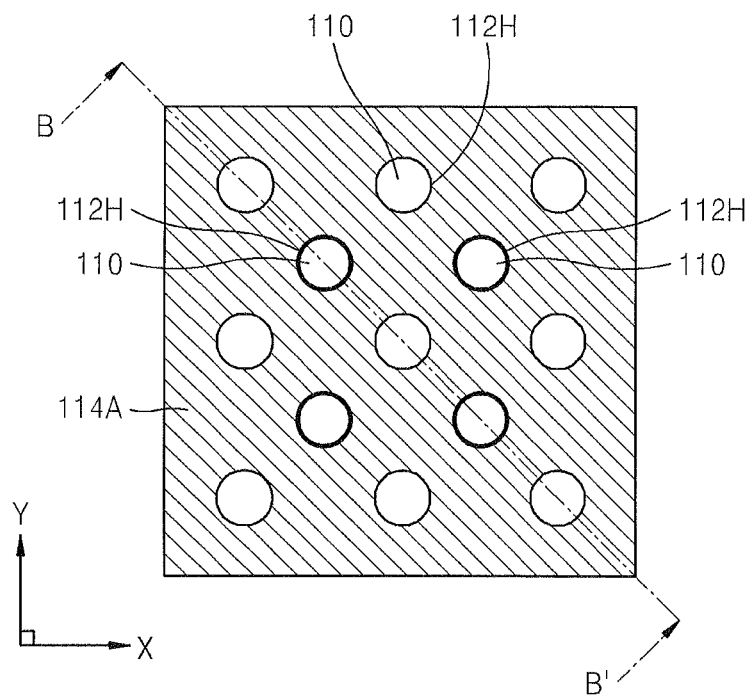
Figure 8B:
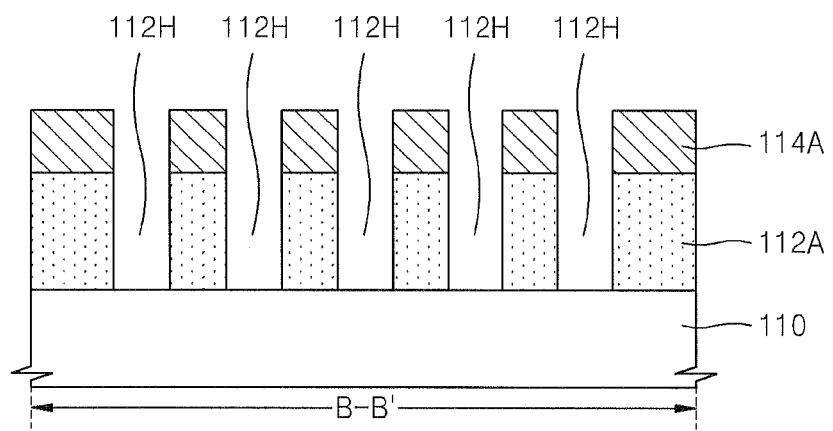

The first holes 132H may be arranged at a density lower than that of the holes 112H of FIGS. 8A and 8B which are finally formed. For example, the pitch of the first holes 132H (e.g., the distance between identical first holes) is greater than that of the holes 112H of FIGS. 8A and 8B. The first holes 132H may be arranged in a matrix form.

Figure 4A:
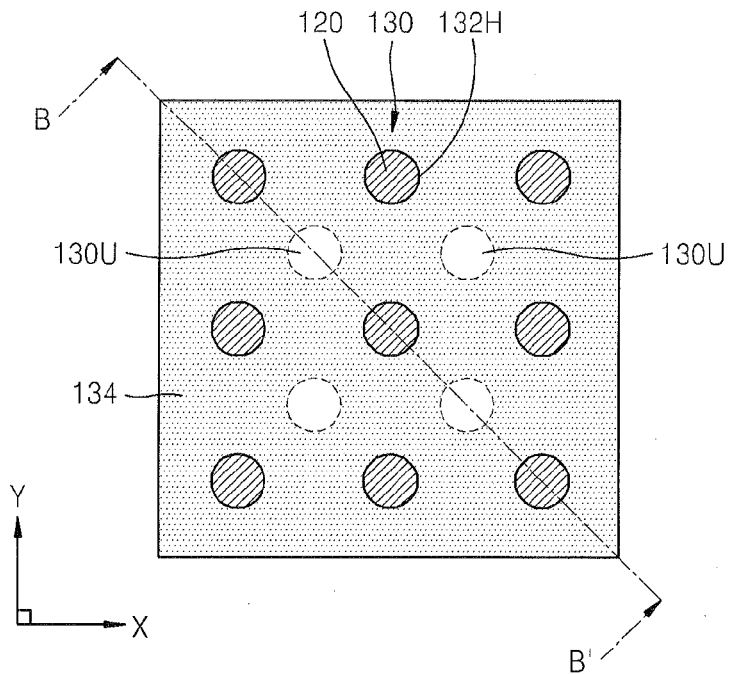
Figure 4B:
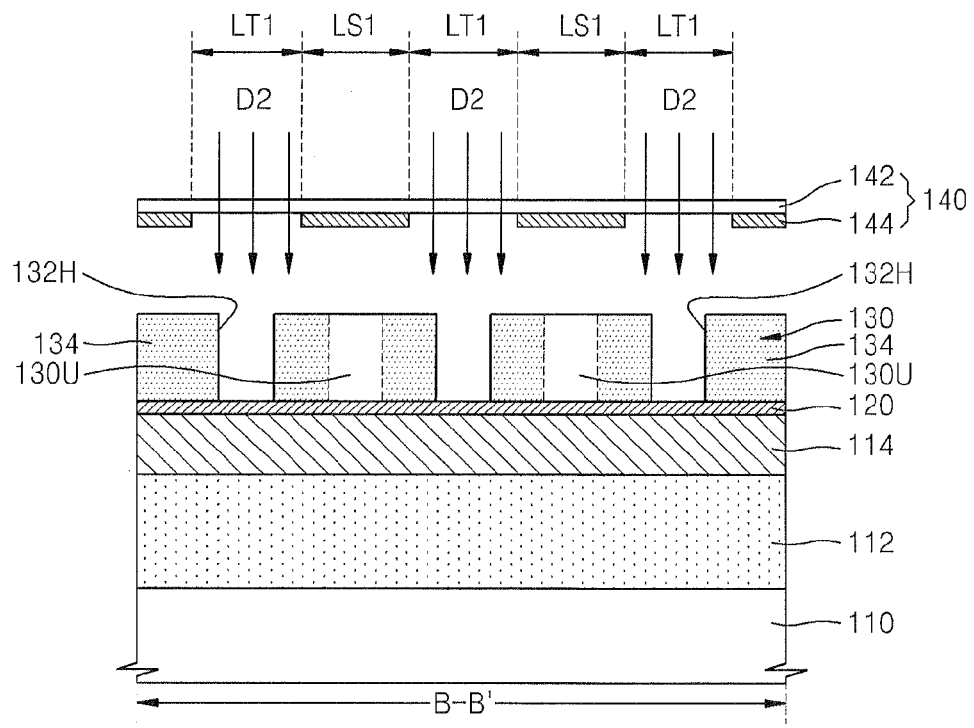

Referring to FIGS. 4A and 4B, a second exposing operation may be performed using the photomask 140. The photomask 140 is aligned at a predetermined location above the substrate 110 having the first holes 132H. The alignment of the photomask 140 with respect to the substrate 110 may be substantially identical to that of the photomask 140 with respect to the substrate 110 for the first exposing operation described with reference to FIGS. 2A and 2B. For example, in the second exposing operation, the photomask is aligned using a same align mark formed on the substrate 110 used in the first exposing operation.

In the second exposing operation, second areas 134 are exposed to a second exposure dose D2 through the light-transmitting areas LT1 of the photomask 140. According to an exemplary embodiment of the inventive concept, the second exposure dose D2 is greater than that of the first exposure dose D1, and the second exposure area 134 is greater than that of the first exposure area 132 of FIG. 2. As a result, the second exposure area 134 may be formed in the photoresist 130, surrounding the first holes 132H.

For example, the second dose D2 may be set to an exposure amount such that the second exposure areas 134 may surround the first holes 132H and include island-shape non-exposed areas 130U beneath the light-shielding patterns 144. The non-exposed areas 130U may include polarity less than the threshold polarity due to zero-exposure or weak exposure. For example, the non-exposed areas 130U may be arranged between the first holes 132H as shown in FIGS. 4A and 4B.

Figure 5A:
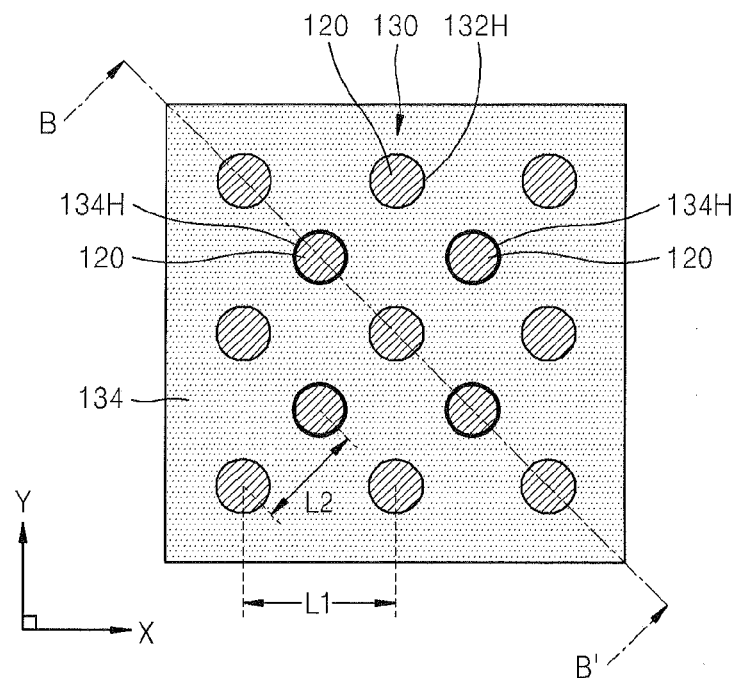
Figure 5B:
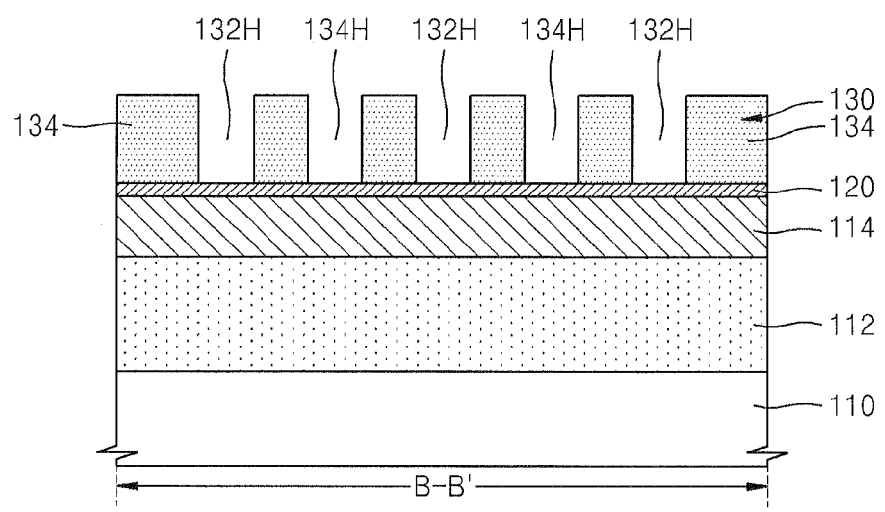

In the second exposing operation, the second dose D2 may be set according to a target size and location of second holes 134H of FIGS. 5A and 5B which are formed in the photoresist film 130. The smaller target size the second holes 134H have, the greater size the second area 134 has. To do this, the second dose D2 may be set to be relatively large. The greater target size the second holes 134H has, the smaller size the second area 134 has. To do this, the second dose D2 may be set to be relatively small. For example, the second dose D2 may be set to an amount of about 60 mJ/cm$^2$. The second holes 134H may be formed between the first holes 132H, having a diameter of about 55 nm.

As illustrated in FIGS. 10A and 10B, the first exposing operation and the second exposing operation are sequentially performed on the photoresist film 130 by using the photomask 140 having the light-transmitting areas LT1 that each have a diamond shape and are arranged in a matrix form. By doing so, shapes of the first exposure area 132 and the second exposure area 134 may be substantially the same.

After the second exposing operation, polarity of the first area 134 of the photoresist film 130 may be increased due to a catalytic reaction of an acid generated by the exposure.

Referring to FIGS. 5A and 5B, the non-exposed areas 130U are selectively removed from the photoresist film 130 to form the second holes 134H passing through the photoresist film 130.

The non-exposed areas 130U may be selectively removed with a second developer including a negative tone developer.

The non-exposed areas 130U may be an area having a zero exposure amount, or an area having an exposure amount which does not generate an amount of acids to change the property of the photoresist film 130. The negative tone developer may be formed of an organic solvent and selectively the non-exposed areas 130U.

After the second holes 134H are formed, the patterned second areas 134 of the photoresist film 130 remain on the substrate 110. The second holes 134H are formed spaced apart from the first holes 132H.

Each of the second holes 134H may be arranged between two neighboring first holes 132H in a direction identical to a diagonal direction of the matrix arrangement of the first holes 132H. A minimum distance L2 between the first hole 132H and the second hole 134H may be smaller than a minimum distance L1 between the first holes 132H. Accordingly, the first holes 132H and the second holes 134H are arranged in a honeycomb structure as shown in FIG. 5A.

The negative tone developer may include a non-polar solvent. In an exemplary embodiment, the negative tone developer may be an aromatic hydrocarbon, such as benzene, toluene, or xylene; cyclohexane, cyclohexanone; a non-cyclic or cyclic ether, such as dimethyl ether, diethyl ether, ethylene glycol, propylene glycol, hexylene glycol, ethylene glycol monomethyl ether, ethylene glycol monoethyl ether, ethylene glycol methyl ethyl ether, diethylene glycol monomethyl ether, diethylene glycol monoethyl ether, diethylene glycol dimethyl ether, propylene glycol methyl ether, propylene glycol ethylether, propylene glycol propyl ether, propylene glycol butyl ether, tetrahydrofuran, or dioxane; an acetate, such as methyl acetate, ethyl acetate, propyl acetate, butyl acetate, methyl hydroxy acetate, ethyl hydroxy acetate, propyl hydroxy acetate, butyl hydroxy acetate, methyl methoxy acetate, ethyl methoxyacetate, propyl methoxy acetate, butylmethoxy acetate, methylethoxy acetate, ethylethoxy acetate, propylethoxy acetate, butylethoxy acetate, methylpropoxy acetate, ethylpropoxy acetate, propylpropoxy acetate, butylpropoxy acetate, methylbutoxy acetate, ethylbutoxy acetate, propylbutoxy acetate, butylbutoxy acetate, propylene glycol methyl ether acetate, propylene glycol ethyl ether acetate, propylene glycol propyl ether acetate, propylene glycol butyl ether acetate, methyl cellosolve acetate, or ethyl cellosolve acetate; a propionate, such as methyl 3-hydroxy propionate, ethyl 3-hydroxy propionate, propyl 3-hydroxy propionate, butyl 3-hydroxy propionate, methyl 2-methoxy propionate, ethyl 2-methoxy propionate, propyl 2-methoxy propionate, butyl 2-methoxy propionate, methyl 2-ethoxypropionate, ethyl 2-ethoxypropionate, propyl 2-ethoxypropionate, butyl 2-ethoxypropionate, methyl 2-butoxypropionate, ethyl 2-butoxypropionate, propyl 2-butoxypropionate, butyl 2-butoxypropionate, methyl 3-methoxypropionate, ethyl 3-methoxypropionate, propyl 3-methoxypropionate, butyl 3-methoxypropionate, methyl 3-ethoxypropionate, ethyl 3-ethoxypropionate, propyl 3-ethoxypropionate, butyl 3-ethoxypropionate, methyl 3-propoxypropionate, ethyl 3-propoxypropionate, propyl 3-propoxypropionate, butyl 3-propoxypropionate, methyl 3-butoxypropionate, ethyl 3-butoxypropionate, propyl 3-butoxypropionate, butyl 3-butoxypropionate, propylene glycol methyl ether propionate, propylene glycol ethylether propionate, propylene glycol propyl ether propionate, or propylene glycol butyl ether propionate; an oxyisobutyric acid ester, such as a butyrate, such as methyl-2-hydroxyisobutyrate, methyl α-methoxyisobutyrate, ethyl methoxyisobutyrate, methyl α-ethoxyisobutyrate, ethyl α-ethoxyisobutyrate, methyl β-methoxyisobutyrate, ethyl β-methoxyisobutyrate, methyl β-ethoxyisobutyrate, ethyl β-ethoxyisobutyrate, methyl β-isopropoxyisobutyrate, ethyl β-isopropoxyisobutyrate, isopropyl β-isopropoxyisobutyrate, butyl β-isopropoxyisobutyrate, methyl β-butoxyisobutyrate, ethyl β-butoxyisobutyrate, butyl β-butoxyisobutyrate, methyl α-hydroxyisobutyrate, ethyl α-hydroxyisobutyrate, isopropyl α-hydroxyisobutyrate, or butyl α-hydroxyisobutyrate; or a lactate, such as methyl lactate, ethyl lactate, propyl lactate, or butyl lactate; and a combination thereof. For example, the negative tone developer may be n-butyl acetate.

In an exemplary embodiment, the anti-reflective coating film 120 exposed by the first holes 132H and the second holes 134H may be removed by the negative tone developer. In an embodiment, the anti-reflective coating film 120 exposed by the first holes 132H and the second holes 134H may be removed by a subsequent operation which is described below with reference to FIGS. 6A and 6B.

Figure 6A:
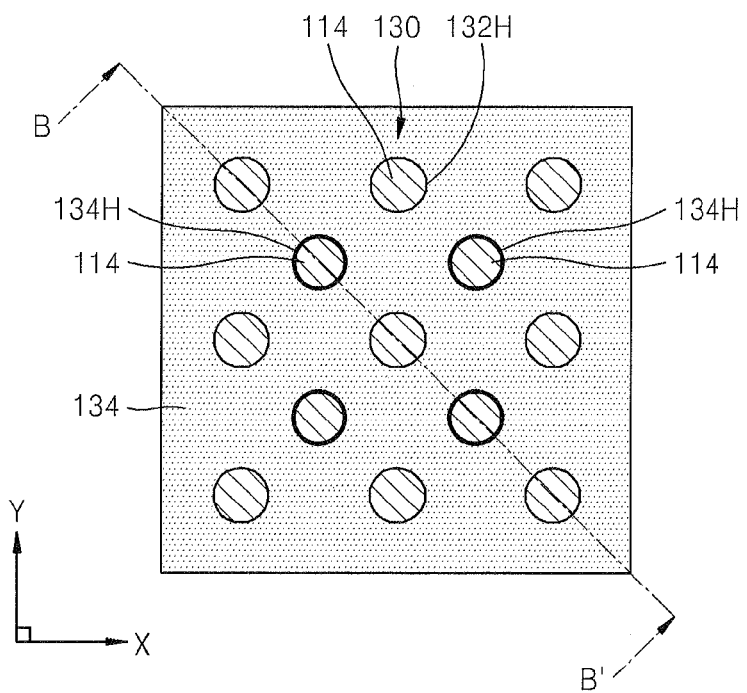
Figure 6B:
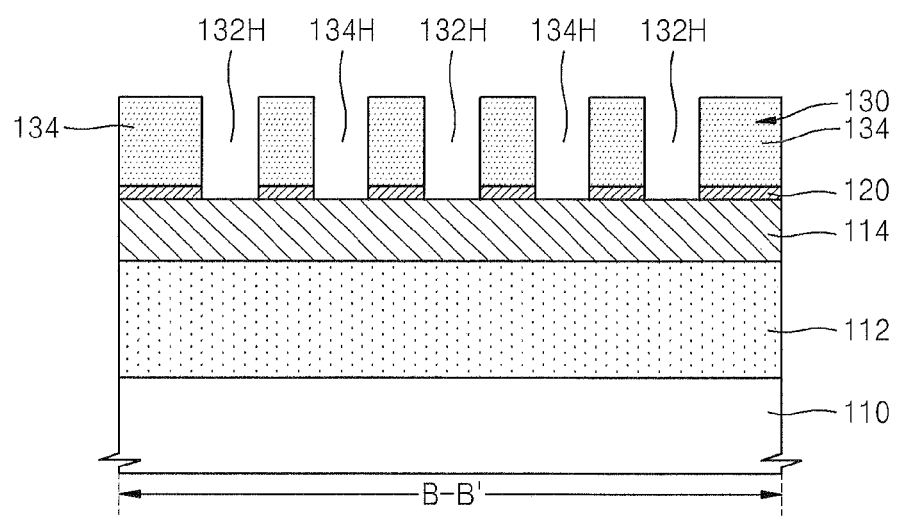

Referring to FIGS. 6A and 6B, portions of the anti-reflective coating film 120 exposed by the first holes 132H and the second holes 134H are removed to expose the hard mask layer 114 underneath the anti-reflective coating film 120.

The exposed portion of the anti-reflective coating film 120 may be removed with an organic solvent. For example, the anti-reflective coating film 120 may include a non-polar organic solvent, or a polar organic solvent, such as an alcohol-based solvent.

Figure 7A:
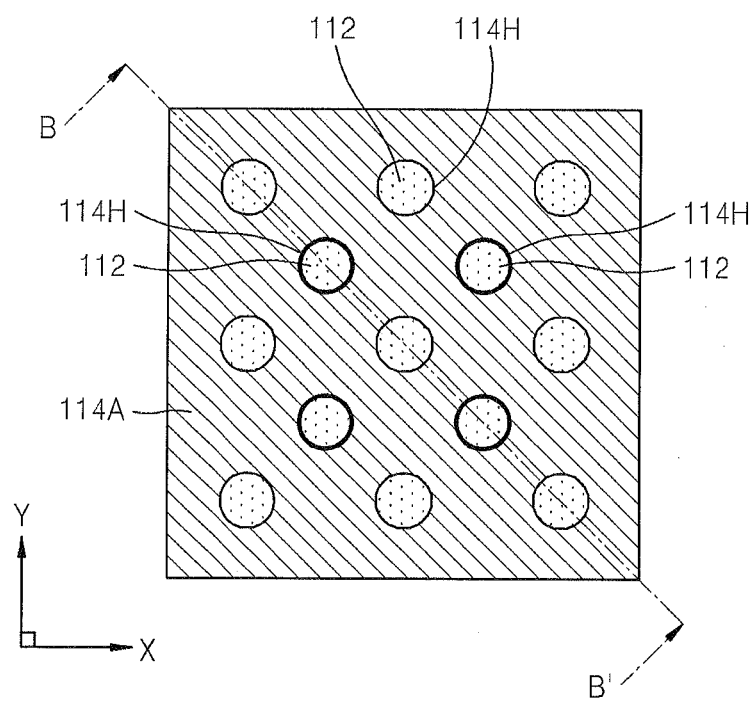
Figure 7B:
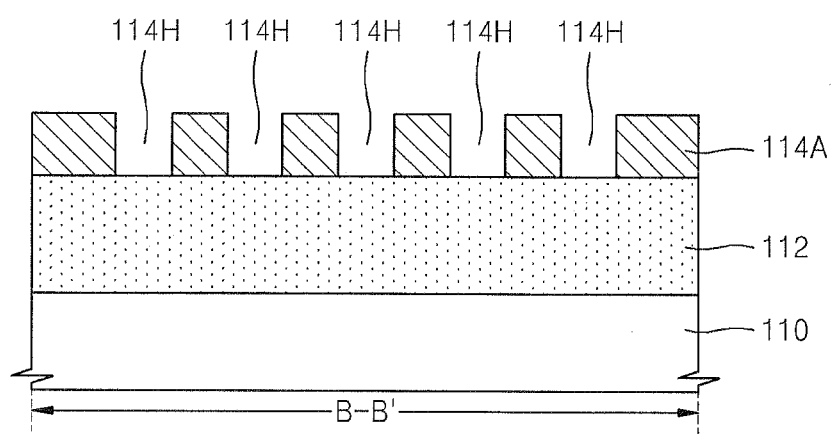

Referring to FIGS. 7A and 7B, a hard mask pattern 114A may be formed by etching the hard mask layer 114 using the second areas 134 of the photoresist film 130 as an etch mask. The hard mask pattern 114A may include holes 114H exposing a to-be-etch film 112 beneath.

The second areas 134 of the photoresist film 130 and the anti-reflective coating film 120 may be removed while etching the hard mask layer 114. In an embodiment, when the anti-reflective coating film 120 and the second areas 134 may remain on the hard mask pattern 114A, the anti-reflective film 120 and the second areas 130 may be removed.

Referring to FIGS. 8A and 8B, the to-be-etched film 112 is etched by using the hard mask pattern 114A as an etch mask to form the holes 112H having a fine pitch.

Figure 9A:
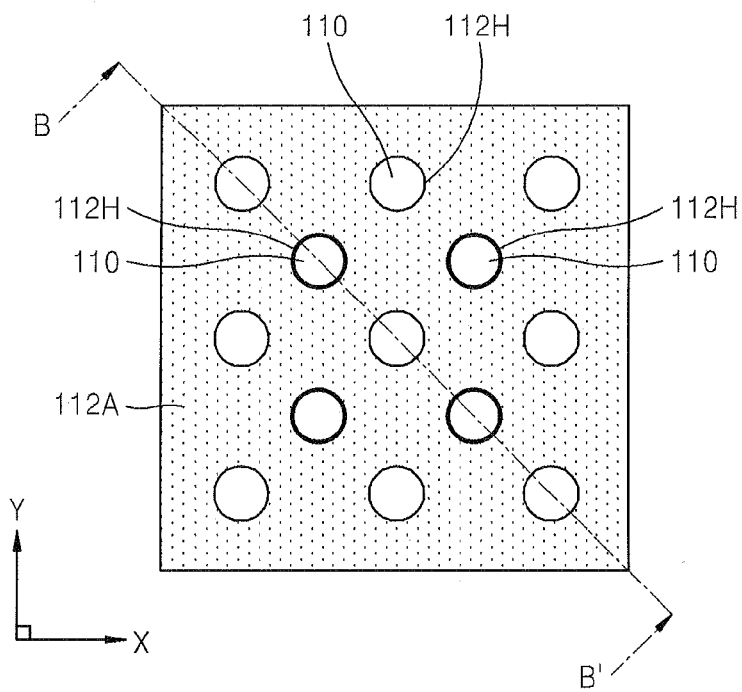
Figure 9B:
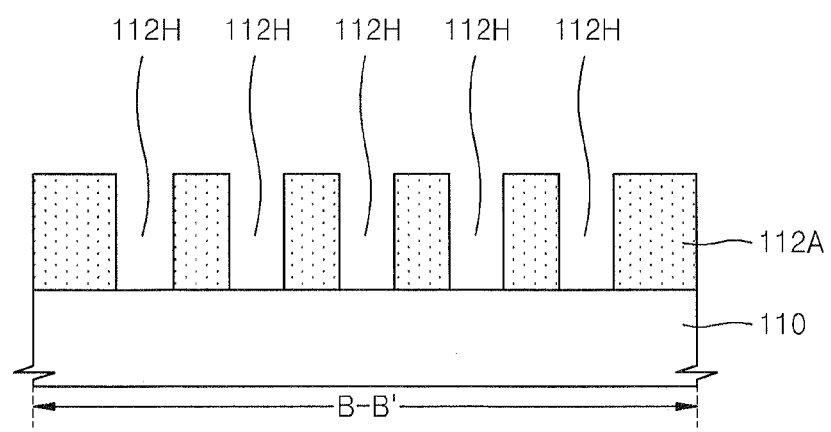

Referring to FIGS. 9A and 9B, the hard mask pattern 114A is removed to expose an upper surface of the patterned to-be-etched film 112A.

Figure 11A:
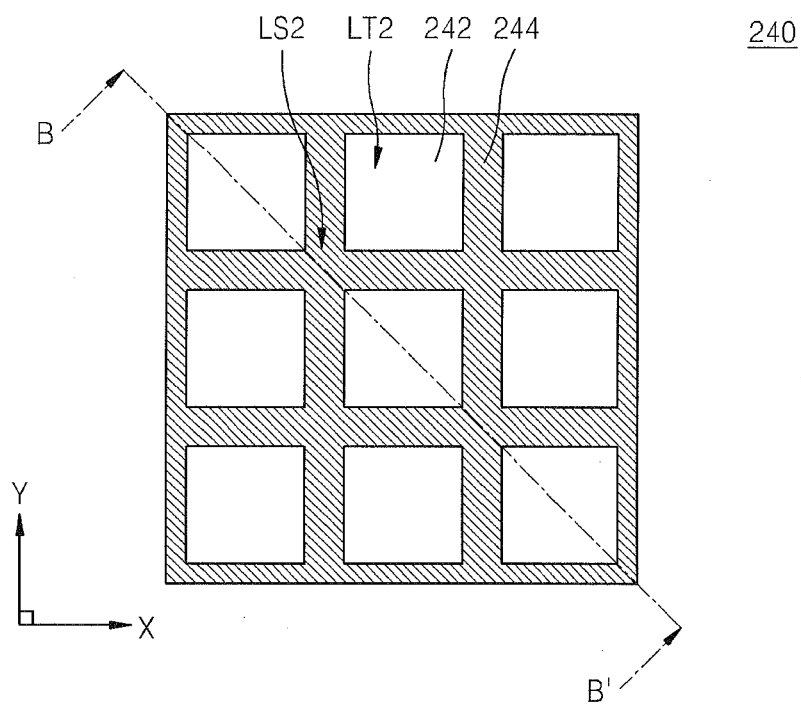
FIG. 11A is a plan view of a photomask that is used in a method of forming patterns according to an exemplary embodiment of the present inventive concept.
Figure 11B:
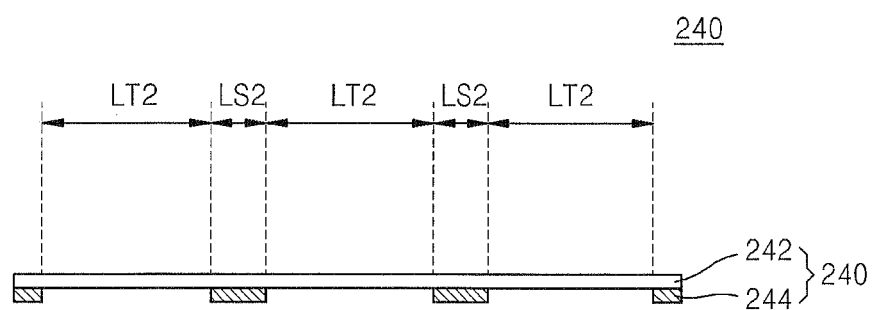
FIG. 11B is a cross-sectional view of line B-B' of FIG. 11A.

FIGS. 11A and 11B illustrate a photomask 240 according to an exemplary embodiment of the inventive concept. FIG. 11A is a plan view of the photomask 240, and FIG. 11B is a cross-sectional view taken along line B-B' of FIG. 11A.

The photomask 240 may be used i in performing the first exposing operation described with reference to FIGS. 2A and 2B and the second exposing operation described with reference to FIGS. 4A and 4B.

Referring to FIG. 11A and FIG. 11B, the photomask 240 may include a quartz substrate 242. Light-shielding patterns 244 may be formed on the quartz substrate 142, defining light-shielding areas LS2. The light-shielding patterns 244 may be formed of a metal layer of chromium (Cr). The light-shielding patterns 244 may have a two-dimensional lattice shape, and may define light-transmitting areas LT2.

Each of the light-transmitting areas LT2 may have a rectangular shape surrounded by the light shielding areas LS2. The light-transmitting areas LT2 may be arranged in a matrix form. For example, the light-transmitting areas LT2 may be repeatedly arranged in the first direction (an X direction of FIG. 11A) and the second direction (a Y direction of FIG. 11A) that is perpendicular to the first direction. The area of each of the light-transmitting areas LT2 may be defined by two outer lines that extend in parallel to the first direction (the X direction of FIG. 11A), and two outer lines that extend in parallel to the second direction (the Y direction of FIG. 11A). In an embodiment, the light-transmitting areas LT2 may each have a square shape.

Hereinafter, a method of forming holes including at least two different shapes will be explained using the photomask 240. FIGS. 12A and 12B to 15A and 15B are plan views and cross-sectional views of a photoresist for explaining a method of forming patterns, according to an exemplary embodiment of the inventive concept. FIGS. 12B-15B are cross-sectional views of lines B-B' of FIGS. 12A-15A, respectively.

Figure 12A:
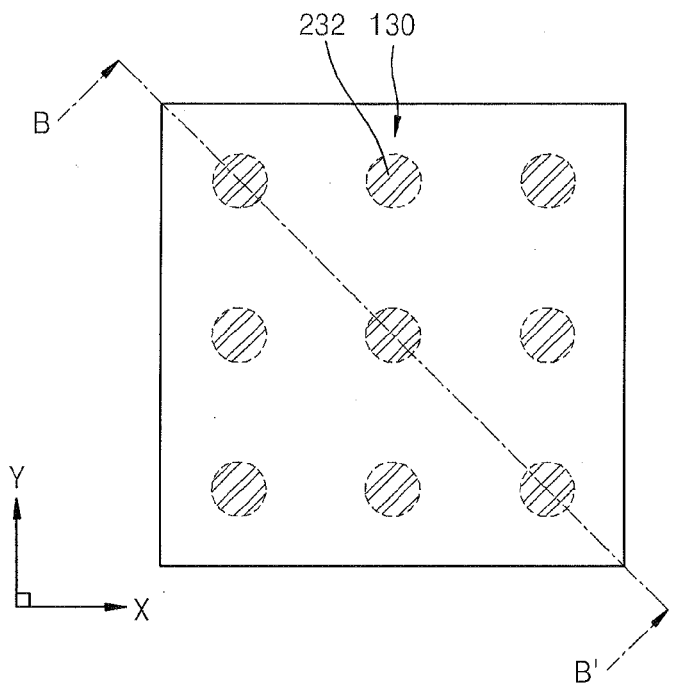
Figure 12B:
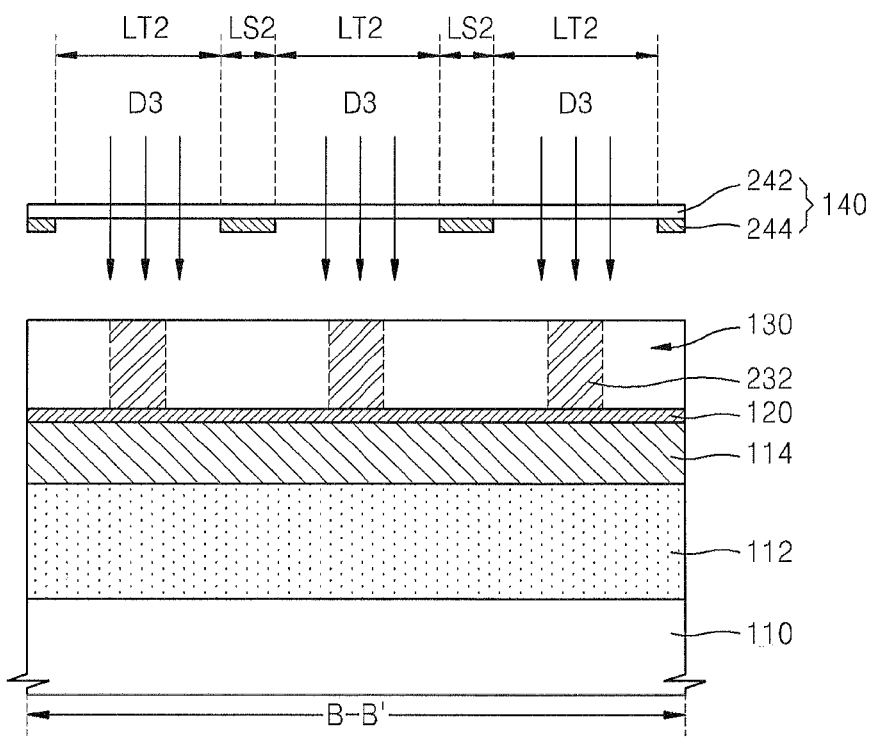
Figure 13A:
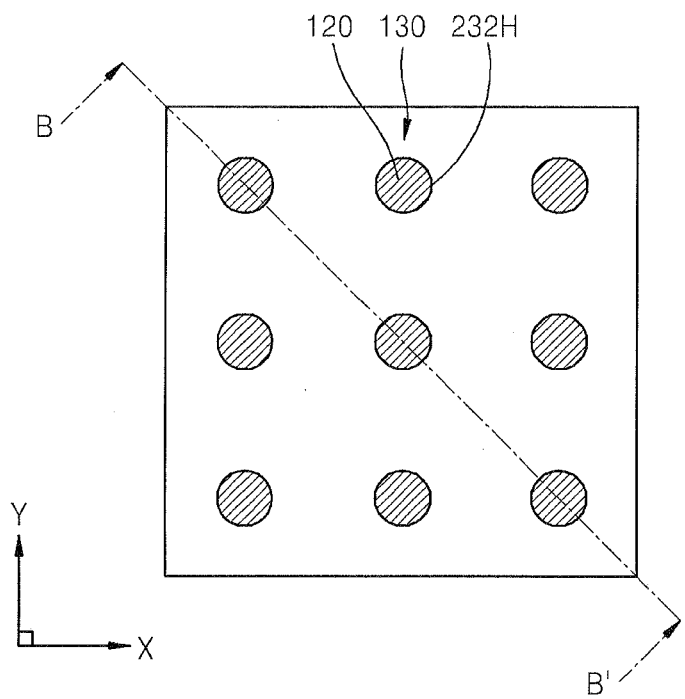
Figure 13B:
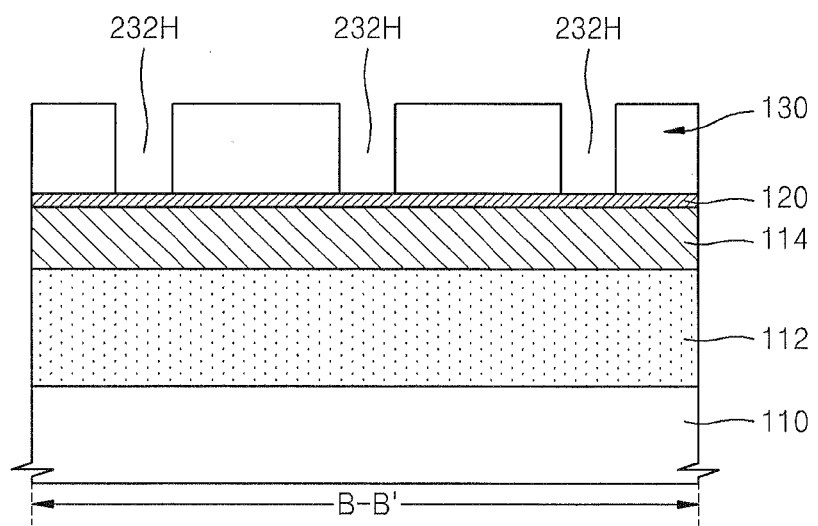

Referring to FIGS. 12A and 12B, a first exposing operation is performed to form a first exposure area 232 using the photomask 240. In the first exposing operation, the photoresist film 130 may be irradiated with a first exposure dose D3. Referring to FIG. 13A and FIG. 13B, like the description presented with reference to FIGS. 3A and 3B, the first exposure areas 232 are selectively removed with a first developer including a positive tone developer, thereby forming first holes 232H passing through the photoresist film 130.

Figure 14A:
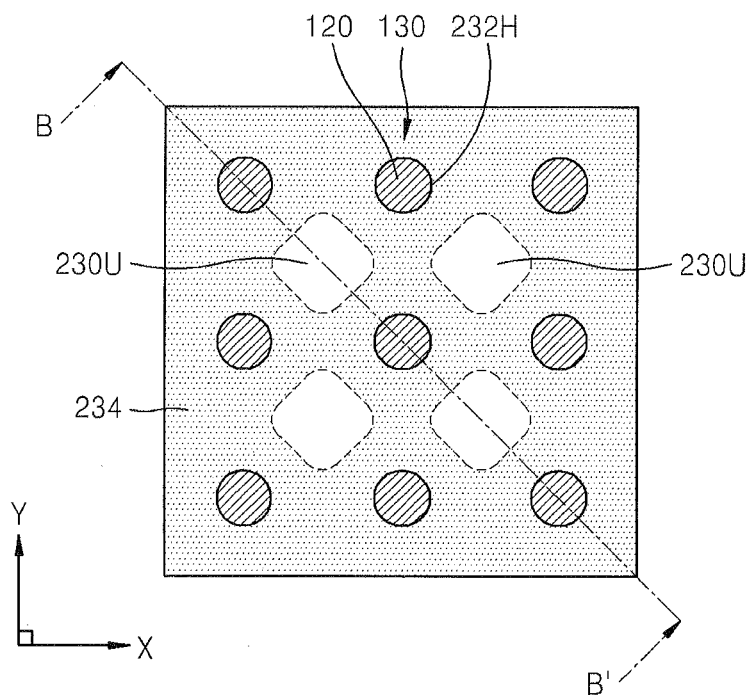
Figure 14B:
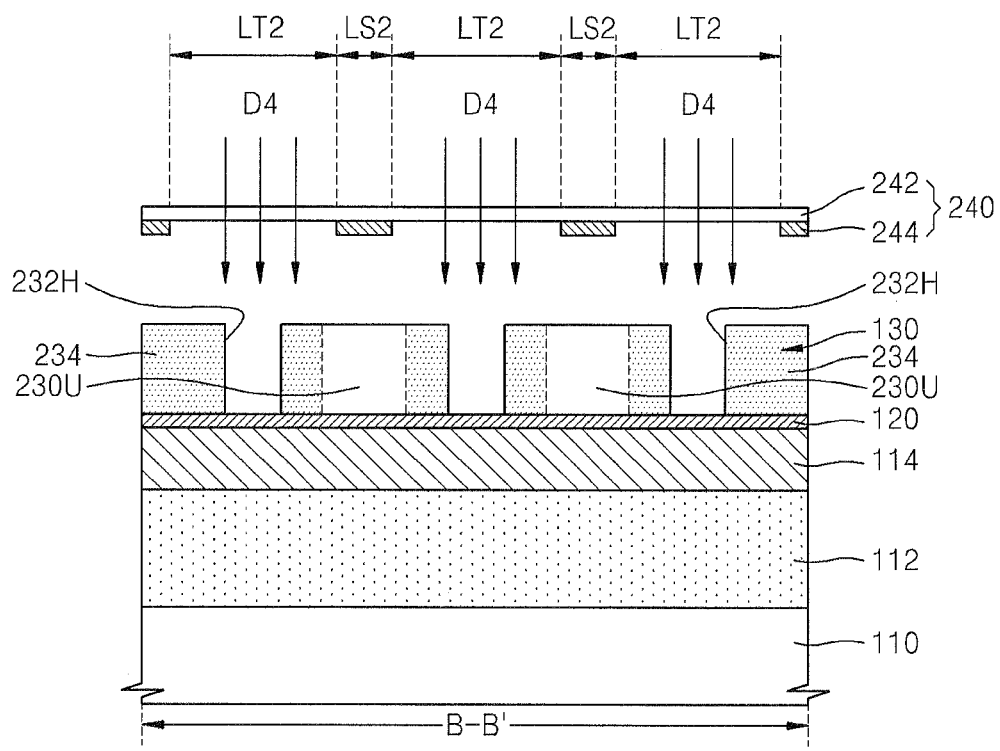

Referring to FIG. 14A and FIG. 14B, in a second exposing operation, the photomask 240 is aligned at a predetermined location above the substrate 110. Then, the photoresist film 130 having the first holes 232H may be irradiated with a second dose D4 through the light-transmitting areas LT2 of the photomask 240.

For example, the second dose D4 is set to an exposure amount such that island-shape non-exposed areas 230U are formed between the first holes 232H. The second dose D4 may be greater than the first dose D3. As illustrated in FIG. 14A, non-exposed areas 230U may each have shapes and/or sizes which are different from those of the first areas 232. In an exemplary embodiment, the non-exposed areas 230U may be larger than the first hole 232H.

Figure 15A:
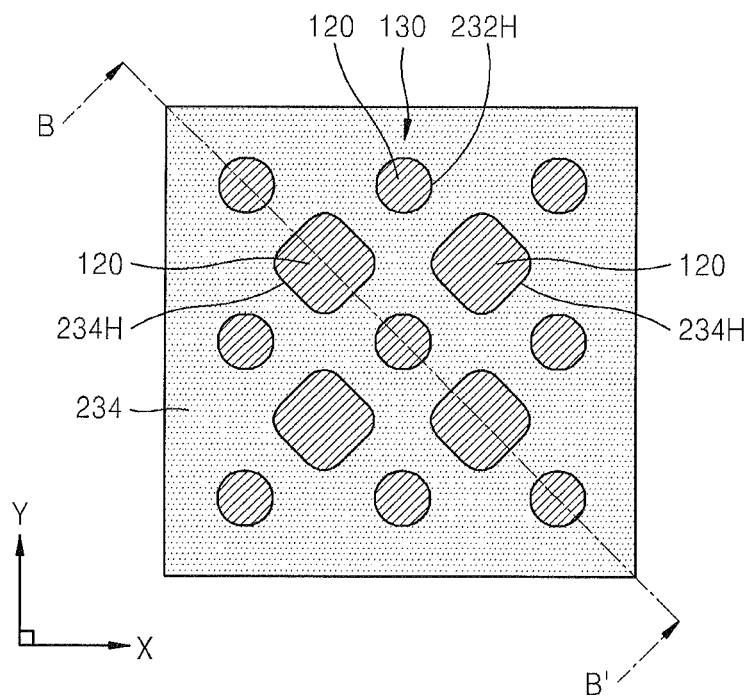
Figure 15B:
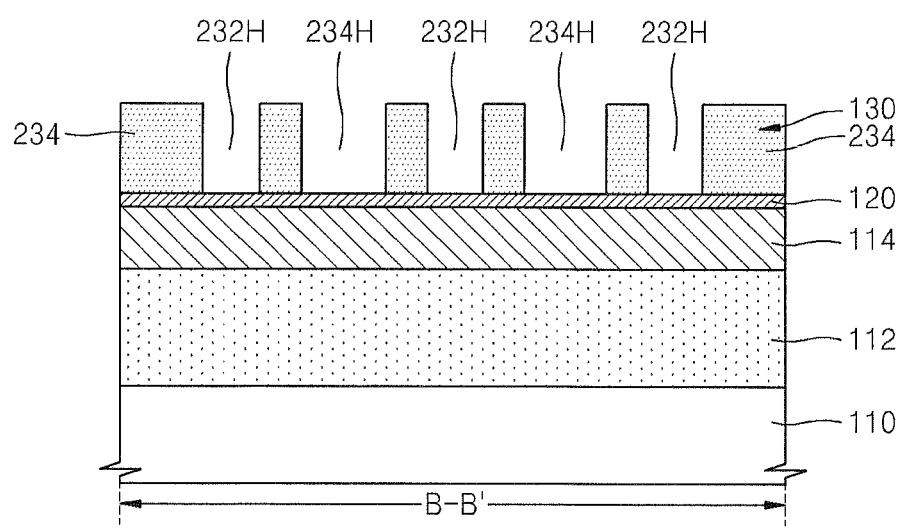

Referring to FIG. 15A and FIG. 15B, the non-exposed areas 230U are selectively removed with a second developer including a negative tone developer, thereby forming second holes 234H passing through the photoresist film 130.

As illustrated in FIG. 15A, the second hole 234H may have a targeted shape and/or size which are/is different from those of the first hole 232H. In an exemplary embodiment of the inventive concept, the second hole 234H has an area greater than that of the first hole 232H.

Thereafter, process operations described with reference to FIGS. 6A and 6B to FIGS. 9A and 9B are performed to form holes in the to-be-etched film 112.

Figure 16:
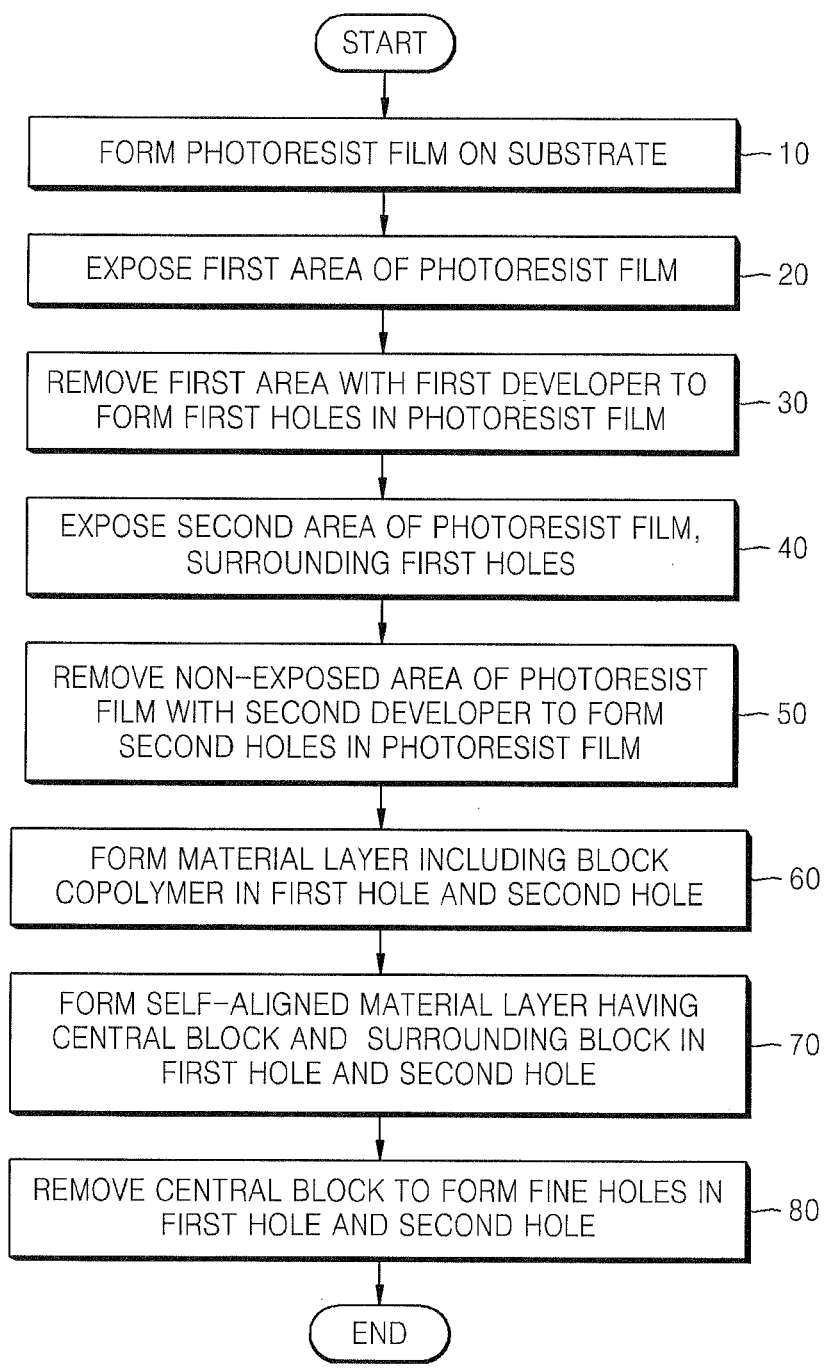
FIG. 16 is a flowchart illustrating a method of forming patterns according to an exemplary embodiment of the present inventive concept.

FIG. 16 is a flowchart illustrating a method of forming patterns according to an exemplary embodiment of the inventive concept. Referring to FIG. 16, operations 10 to 50 are process operations described with reference to FIG. 1. For simplicity of explanation, some explanations for those operations are omitted here. In operation 60, a material layer including a block copolymer is formed on the structure resulting from the process operation of 50. For example, the material layer is formed in at least one first hole and at least one second hole.

In operation 70, the material layer is re-aligned to form a self-aligned material layer whose central block includes a first polymer block and whose surrounding block includes a second polymer block that is different from the first polymer block. The re-aligned material layer are formed in the at least one first hole and the at least one second hole.

In an exemplary embodiment, to form the self-aligned material layer, the material layer may be annealed at a temperature higher than a glass transition temperature of the block copolymer included in the material layer. For example, the annealing may be performed at a temperature of about 100° C. to about 250° C. for about 1 minute to about 24 hours.

By annealing the material layer, the block copolymer including the first polymer block and the second polymer block are self-aligned in the first holes and the second holes according to polarity of the polymer blocks, thereby forming the central block and the surrounding block. In other embodiments, the self-aligning of polymer blocks may be voluntarily performed without annealing.

In operation 80, the central block is removed such that the at least one first hole and at least one second hole become fine holes smaller than the first hole and the second hole. Each of the fine holes may have a diameter smaller than those of the first hole and the second hole. The fine holes may be spaced apart from each other at a equal distance. For example, the central block is removed by O2 plasma.

FIGS. 17A and 17B to 22A and 22B are plan views and cross-sectional views for explaining the method of forming patterns according to the flowchart of FIG. 16. FIGS. 17B-22B are cross-sectional views of lines B-B' of FIGS. 17A-22A, respectively.

Figure 17A:
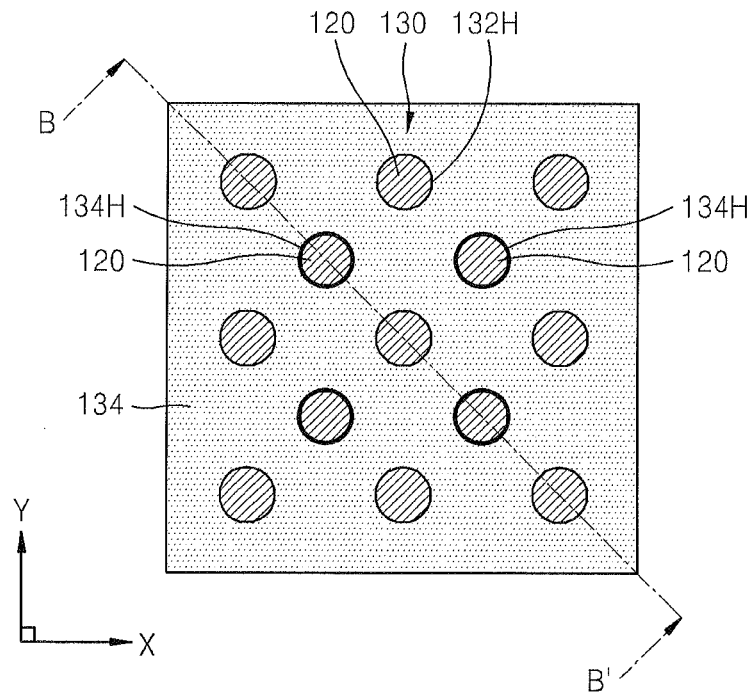
Figure 17B:
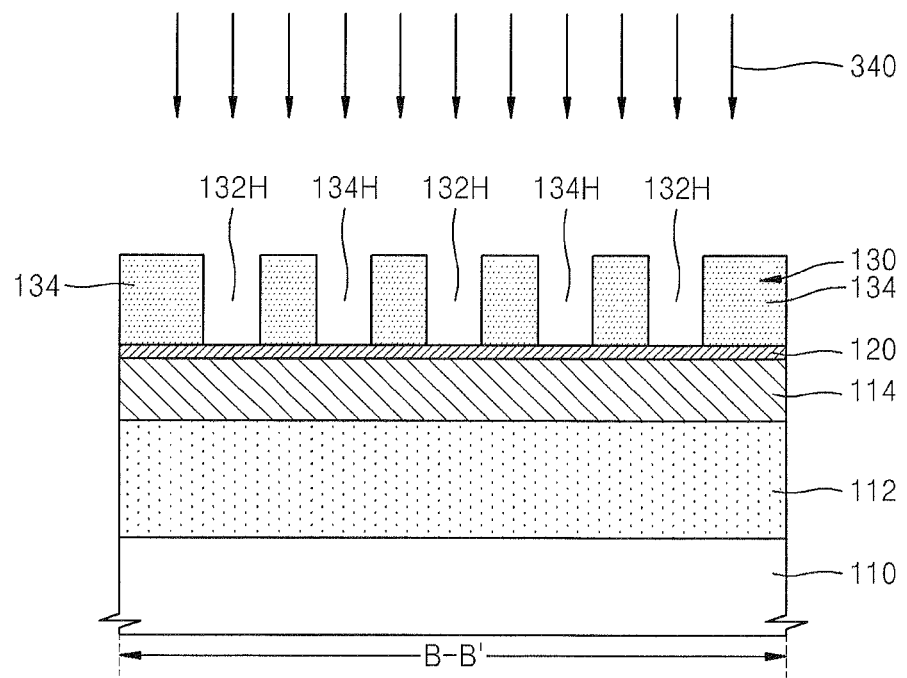

Referring to FIGS. 17A and 17B, the first holes 132H and the second holes 134H are formed in the photoresist film 130 upon completion of the operations 10 to 50 of FIG. 16. The anti-reflective coating film 120 is formed of an organic ARC material. The anti-reflective coating film 120 is formed by coating an organic ARC material on the hard mask layer 114, followed by heat treating to cross-link the organic ARC material. The exposed surface of the anti-reflective coating film 120 and the exposed surface of the second areas 134 of the photoresist film 130 are hydrophilized by treatment of Ar plasma 340. In an exemplary embodiment of the inventive concept, the Ar plasma 340 treatment operation may be omitted.

Figure 18A:
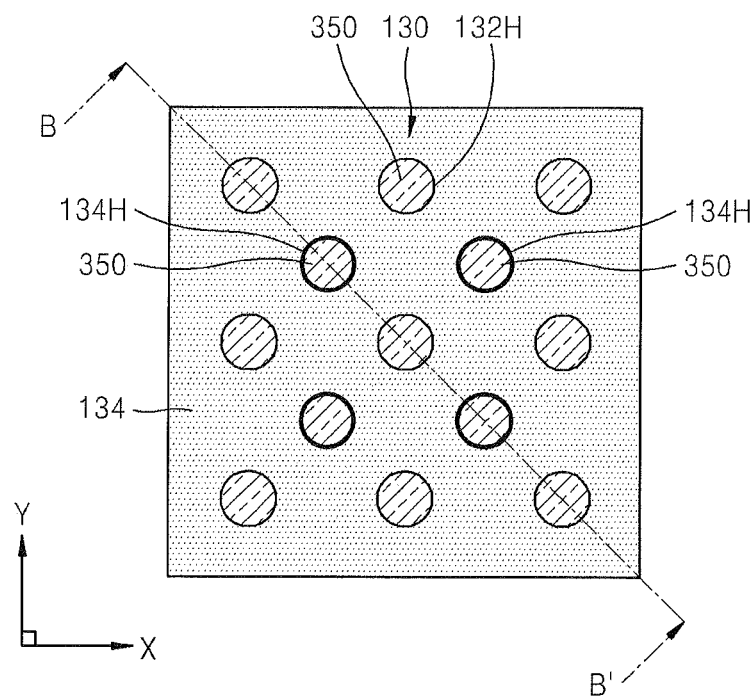
Figure 18B:
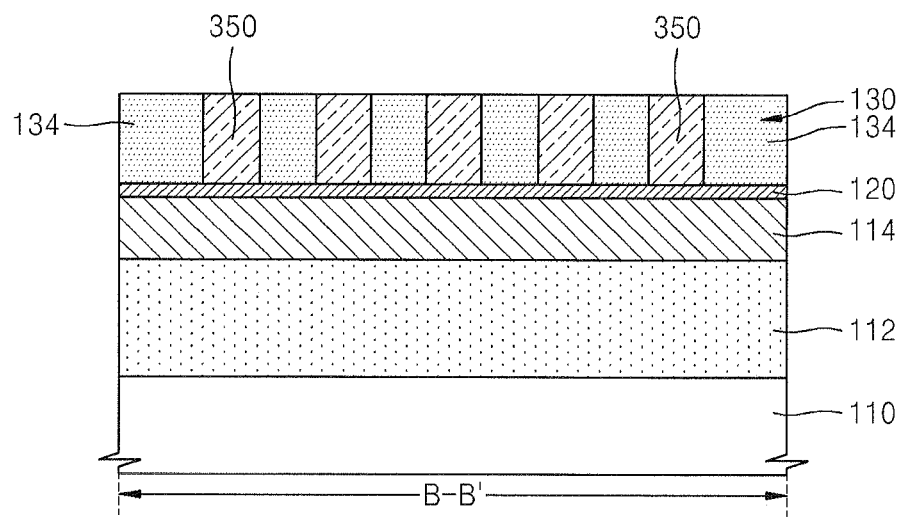

Referring to FIGS. 18A and 18B, a material layer 350 including a block copolymer is formed, filling the first holes 132H and the second holes 134H. The material layer 350 may be formed by a spin coating method.

The block copolymer of the material layer 350 may include two polymer blocks. For example, the block copolymer may include an AB copolymer including two different polymer blocks (polymer block A and polymer block B). The block copolymer may include a linear or branched polymer having a molecular weight of about 3,000 g/mol to about 2,000,000 g/mol.

For example, the block copolymer are a polystyrene-polymethyl metacrylate copolymer, a polybutadiene-polybutylmethacrylate copolymer, a polybutadiene-polydimethylsiloxane copolymer, a polybutadiene-polymethylmethacrylate copolymer, a polybutadiene-polyvinylpyridine copolymer, a polybutylacrylate-polymethylmethacrylate copolymer, a polybutylacrylate-polyvinylpyridine, a polyisoprene-polyvinylpyridine copolymer, a polyisoprene-polymethylmethacrylate copolymer, a polyhexylacrylate-polyvinylpyridine copolymer, a polyisobutylene-polybutylmethacrylate copolymer, a polyisobutylene-polymethylmethacrylate copolymer, a polyisobutylene-polybutylmethacrylate copolymer, a polyisobutylene-polydimethylsiloxane copolymer, a polybutylmethacrylate-polybutylacrylate copolymer, a polyethylethylene-polymethylmethacrylate copolymer, a polystyrene-polybutylmethacrylate copolymer, a polystyrene-polybutadiene copolymer, a polystyrene-polyisoprene copolymer, a polystyrene-polydimethylsiloxane copolymer, a polystyrene-polyvinylpyridine copolymer, a polyethylethylene-polyvinylpyridine copolymer, a polyethylene-polyvinylpyridine copolymer, a polyvinylpyridine-polymethylmethacrylate copolymer, a polyethyleneoxide-polyisoprene copolymer, a polyethyleneoxide-polybutadiene copolymer, a polyethyleneoxide-polystyrene copolymer, a polyethyleneoxide-polymethylmethacrylate copolymer, a polyethyleneoxide-polydimethylsiloxane copolymer, and a polystyrene-polyethyleneoxide copolymer.

In an embodiment of the inventive concept, the block copolymer of the material layer 350 may include a first polymer block including polystyrene and a second polymer block including polymethylmethacrylate. The volumetric ratio of the first polymer block and the second polymer block of the material layer 350 may determine the size of a fine hole 352H which is finally formed in FIGS. 20A and 20B. For example, the material layer 350 may include a block copolymer where a first polymer block includes polystyrene and a second polymer block including polymethylmethacrylate at a volumetric ratio of about 65:35.

Figure 19A:
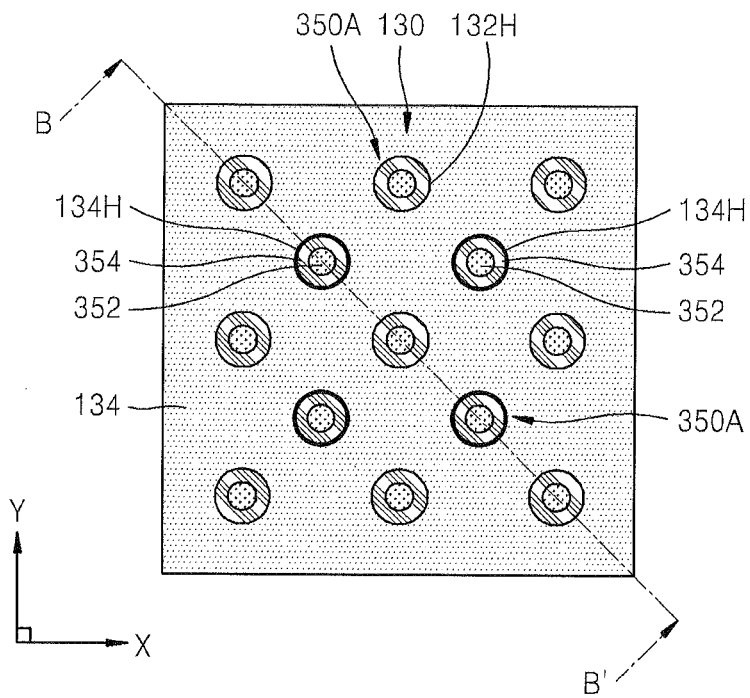
Figure 19B:
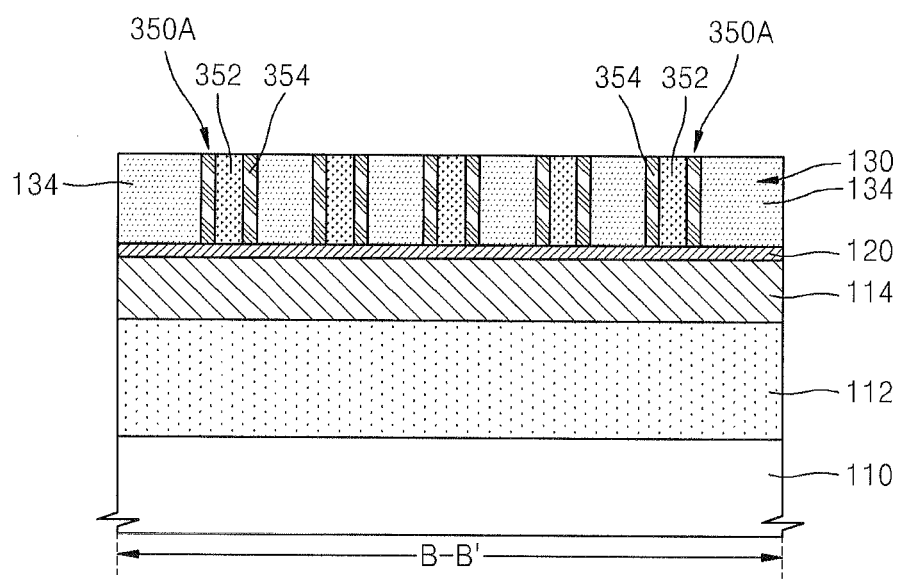

Referring to FIGS. 19A and 19B, the material layer 350 is re-aligned such that the block copolymer is separated into a central block 352 including a first polymer block and a surrounding block 354 including a second polymer block. The second polymer block is different from the first polymer block.

The central block 352 is self-aligned at a center of the first hole 132H. For example, the central block 352 may have a cylinder shape vertically extending at the center of the first hole 132H. The central block 352 may be formed on the anti-reflective coating film 120 within the first hole 132H. In substantially the same way, the central block 352 is also self-aligned at a center of the second hole 134H. A planar shape of the central blocks 352 may be substantially circular. The central blocks 352 are surrounded by the surrounding blocks 354 in the first holes 132H and the second holes 134H.

In an exemplary embodiment of the inventive concept, to form the self-aligned material layer 350A by phase-separating and re-aligning polymer blocks of the material layer 350, the material layer 350 may be annealed at a temperature higher than a glass transition temperature of the block copolymer included in the material layer. For example, the annealing may be performed at a temperature of about 100° C. to about 250° C. for about 1 minute to about 24 hours. The block copolymer may include a first polymer block and a second polymer block. In annealing the material layer 350, the polymer blocks are self-aligned in the first holes 132H and the second holes 134H according to polarity of the polymer blocks, thereby forming the central block 352 and the surrounding block 354. In an exemplary embodiment of the inventive concept, the self-aligning of polymer blocks may occur voluntarily without annealing.

In an exemplary embodiment of the inventive concept, the first polymer block of the central block 352 is polymethylmethacrylate, and the second polymer block of the surrounding block 354 is polystyrene.

Figure 20A:
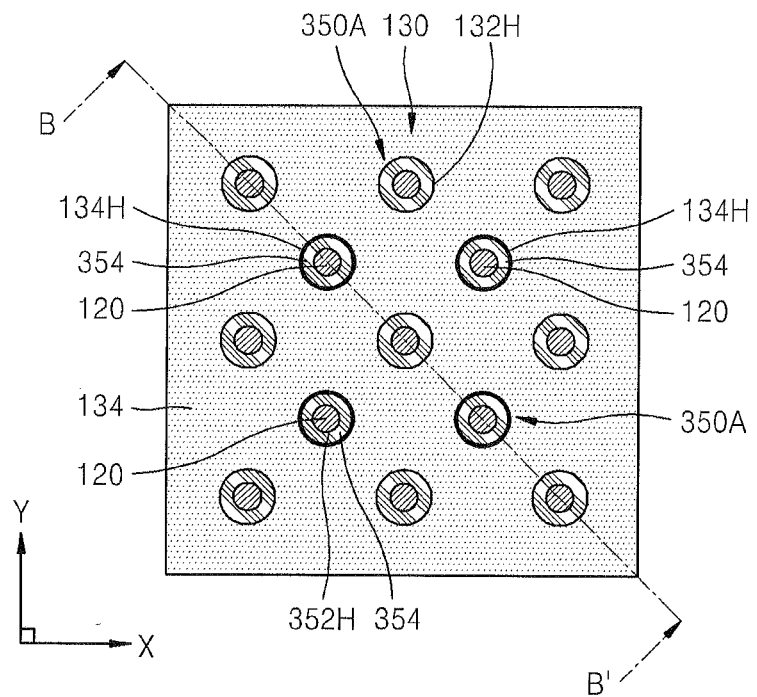
Figure 20B:
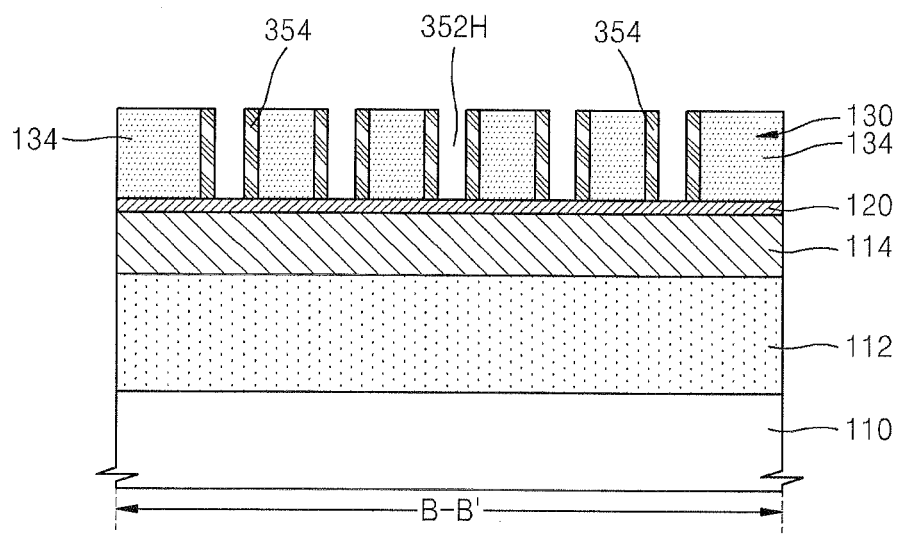

Referring to FIGS. 20A and 20B, the fine holes 352H are formed in the first holes 132H and the second holes 134H by removing the central block 352. In removing the central block 352, the surrounding block 354 may remain in the first holes 132H and the second holes 134H, thereby reducing the first holes 132H and the second holes 134H to the fine holes 352H.

For the removal of the central block 352, the self-aligned polymer blocks may be treated by oxygen plasma or UV irradiation and the first polymer block of the central block 352 may be photolyzed, and then the photolyzed portion is stripped by using a washing solution.

Each of the fine holes 352H may have a diameter smaller than those of the first holes 132H and second holes 134H. The fine holes 352H may have a substantially circular planar shape. The fine holes 352H may be arranged at equal intervals from each other. Accordingly, the fine holes 352H may be arranged with a uniform pitch, and excellent critical dimension (CD) uniformity may be obtained.

Figure 21A:
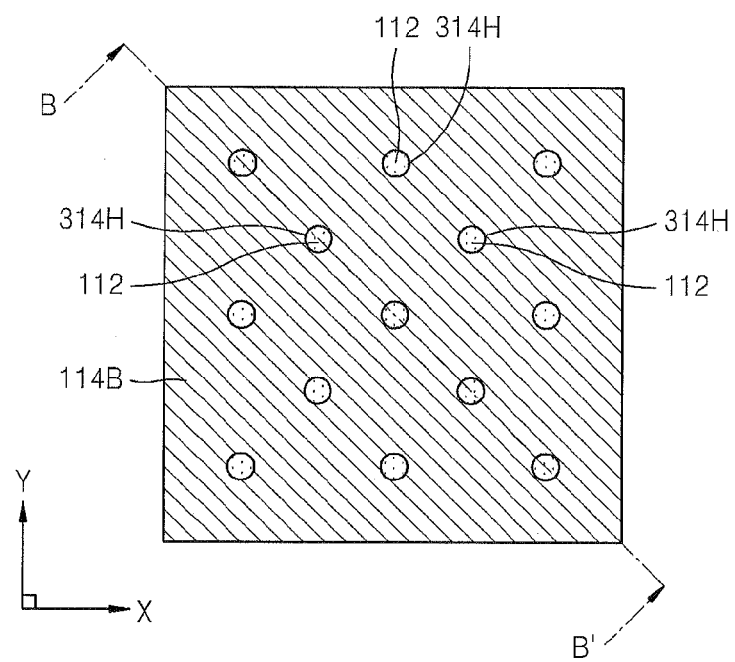
Figure 21B:
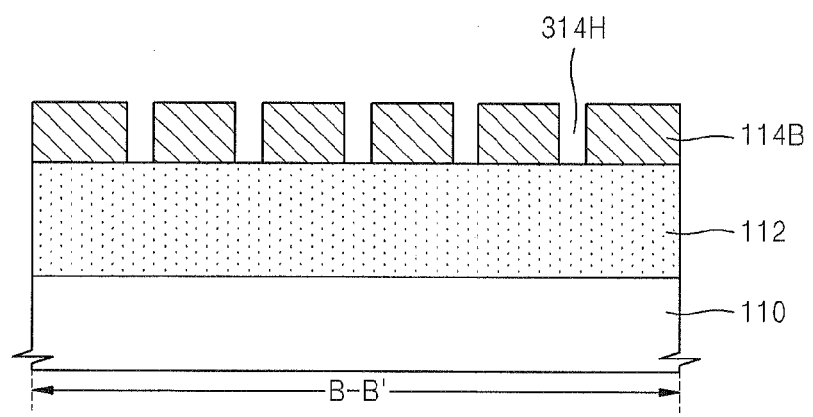

Referring to FIGS. 21A and 21B, portions of the anti-reflective coating film 120 exposed by the surrounding blocks 354 are removed with the same method as described with reference to FIGS. 6A and 6B. The hard mask layer 114 is etched by using the surrounding blocks 354 and the second area 134 of the photoresist film 130 as an etch mask, thereby forming the hard mask pattern 114B having a plurality of fine holes 314H.

In forming the hard mask pattern 114B, the surrounding blocks 354, the second area 134 of the photoresist film 130, and the anti-reflective coating film 120 may be removed. In an embodiment of the inventive concept, when the second area 134 of the photoresist film 130, the surrounding blocks 354 and the anti-reflective coating film 354 remains on the hard mask pattern 114B, they may be removed by an additional process.

Figure 22A:
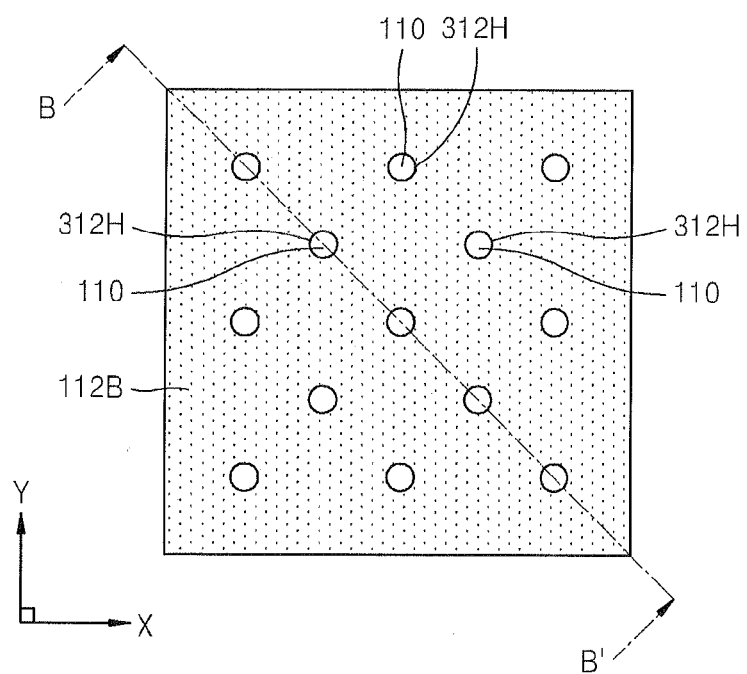
Figure 22B:
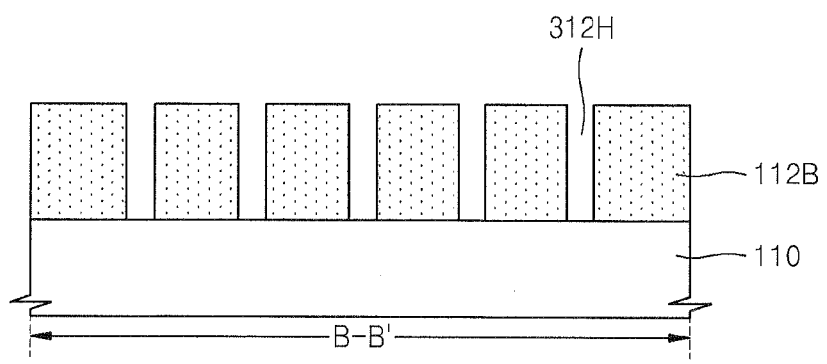

Referring to FIGS. 22A and 22B, the to-be-etched film 112 is etched by using the hard mask pattern 114B of FIGS. 21A and 21B as an etch mask by using a method like that described with reference to FIGS. 8A and 8B, thereby forming a fine pattern 112B having a plurality of fine holes 312H.

Thereafter, the hard mask pattern 114B is removed to expose an upper surface of the fine pattern 112B.

FIGS. 23A and 23B to 28A and 28B are plan views and cross-sectional views for explaining a method of forming patterns, according to an exemplary embodiment of the inventive concept. FIGS. 23B-28B are cross-sectional views of lines B-B' of FIG. 23A-28A, respectively.

Figure 23A:
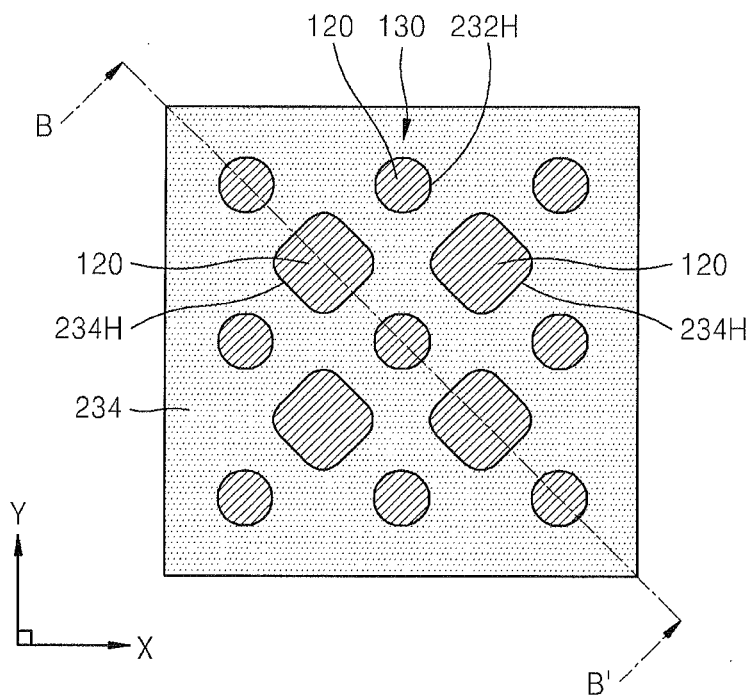
Figure 23B:
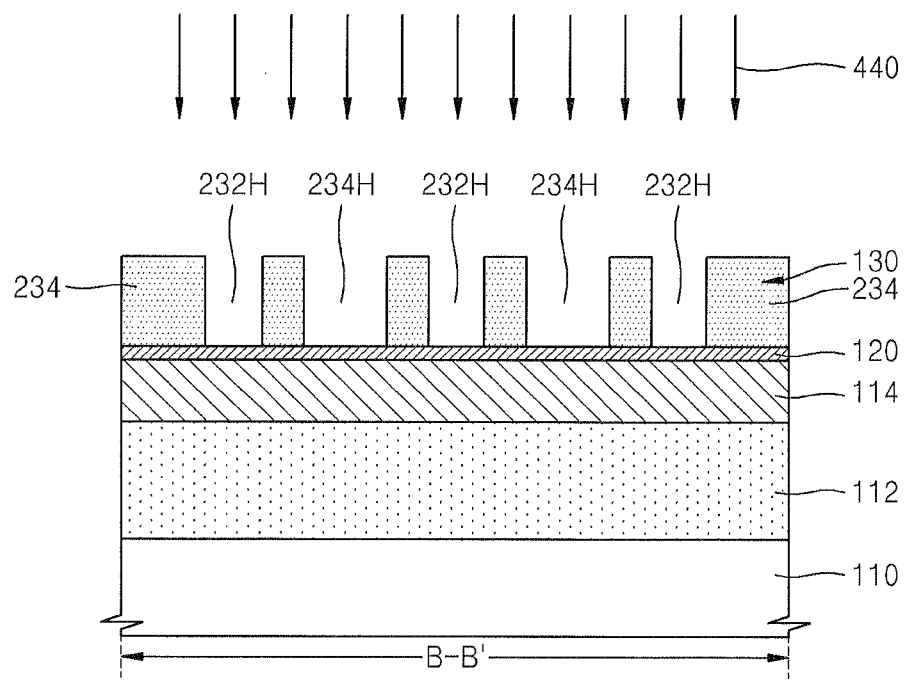

Referring to FIGS. 23A and 23B, after the first holes 232H and the second holes 234H are formed in the photoresist film 130 on the substrate 110 by using the operations described with reference to FIGS. 12A and 15B, the exposed surface of the anti-reflective coating film 120 and the exposed surface of the second area 134 of the photoresist film 130 are hydrophilized by the treatment of Ar plasma 440.

The anti-reflective coating film 120 may be formed of an organic ARC material.

In an exemplary embodiment of the inventive concept, the Ar plasma 440 treatment operation may be omitted.

Figure 24A:
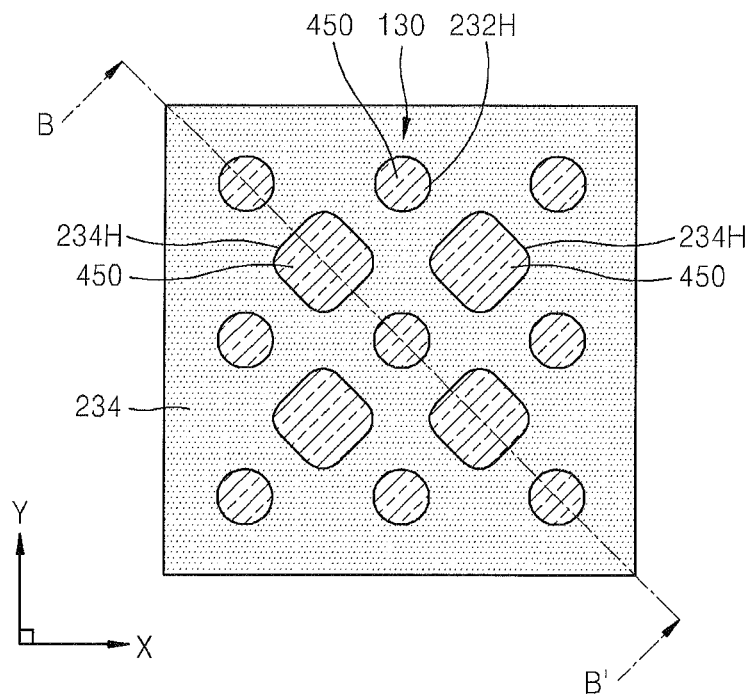
Figure 24B:
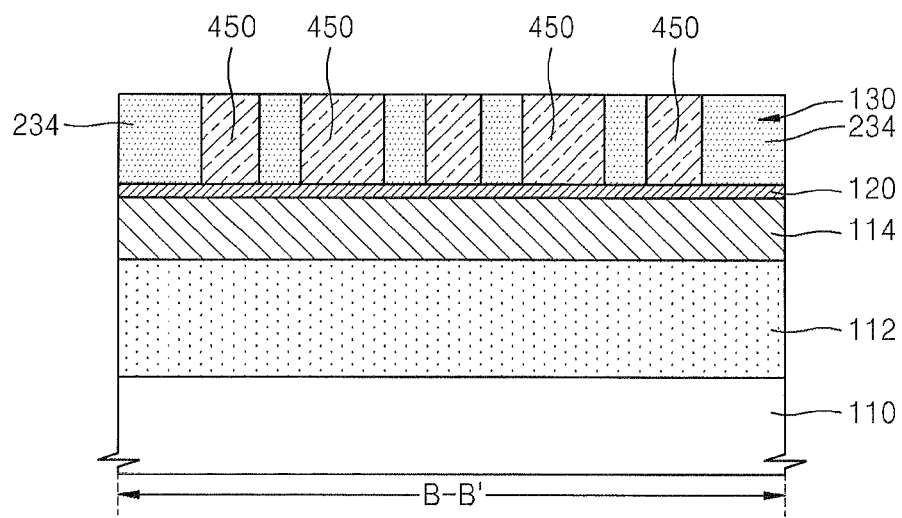

Referring to FIGS. 24A and 24B, a material layer 450 including a block copolymer is formed, filling the first holes 232H and the second holes 234H by a spin-coating method. The material layer 450 may be substantially the same as that of the material layer 350 of FIGS. 18A and 18B.

Figure 25A:
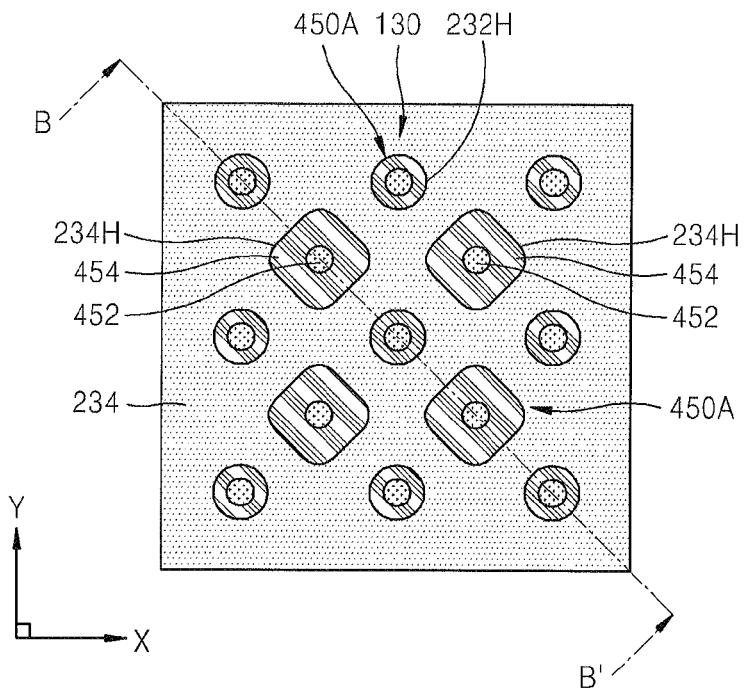
Figure 25B:
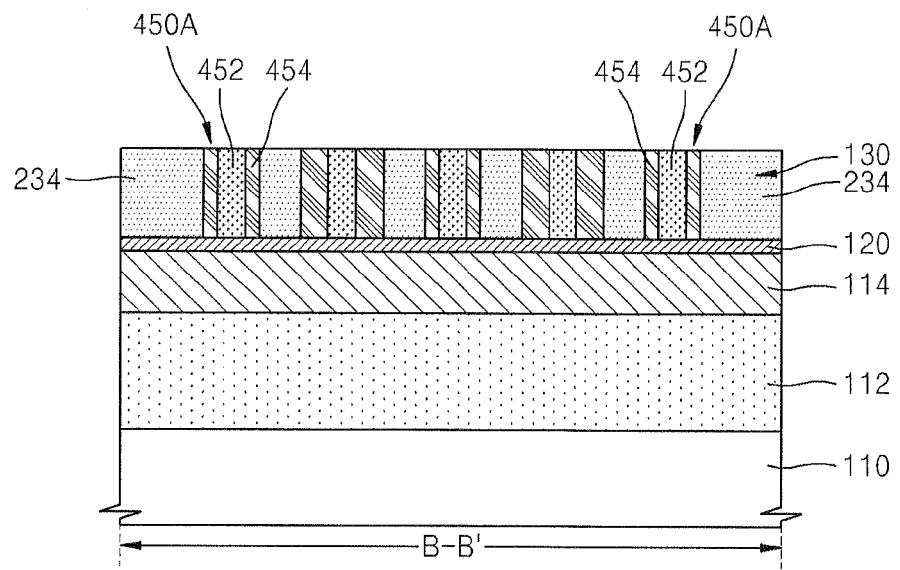

Referring to FIGS. 25A and 25B, the material layer 450 is re-aligned by using a method like that described with reference to FIGS. 19A and 19B. The self-aligned material layer 450A may include a central block 452 including a first polymer block, and a surrounding block 454 including a second polymer block that is different from the first polymer block.

The central blocks 452 are self-aligned in a cylinder shape vertically extending on the anti-reflective coating film 120 within the first holes 232H and the second holes 234H. The central blocks 452 may have a substantially circular shape. The central blocks 452 are surrounded by the surrounding blocks 454 in the first holes 232H and the second holes 234H.

In an exemplary embodiment of the inventive concept, the first polymer block of the central block 452 is polymethylmethacrylate, and the second polymer block of the surrounding block 454 is polystyrene.

Figure 26A:
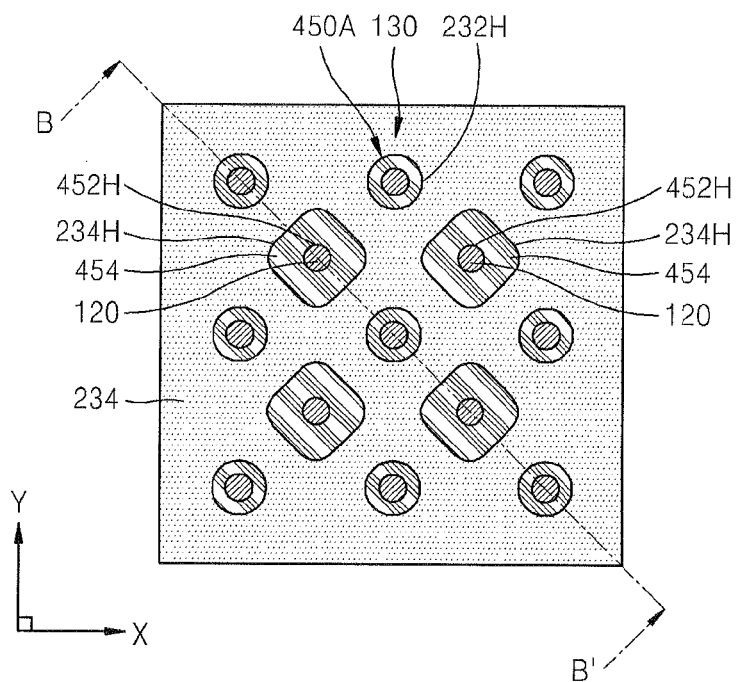
Figure 26B:
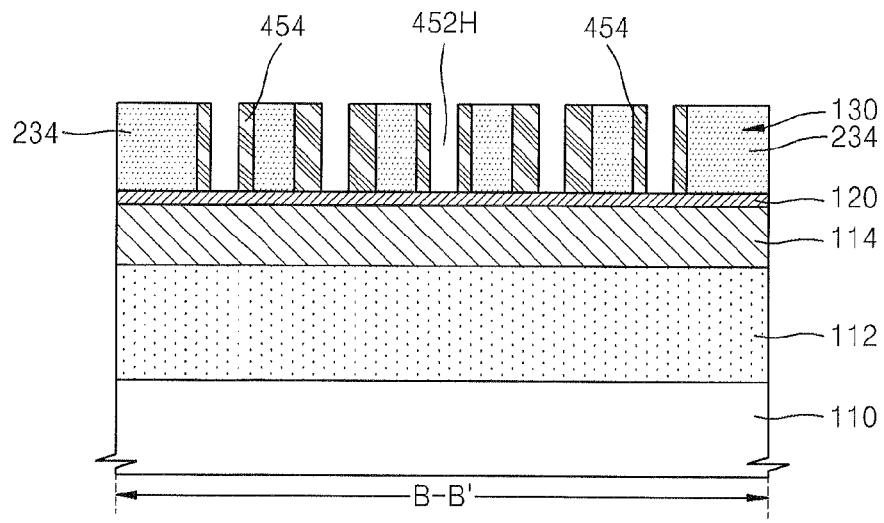

Referring to FIGS. 26A and 26B, the central block 452 is removed from the self-aligned material layer 450A by using a method like that described with reference to FIGS. 20A and 20B to form fine holes 452H. The fine holes 452H are disposed in the first holes 232H and the second holes 234H. For example, each of the fine holes 452H may have a diameter smaller than those of the first holes 232H and second holes 234H. The fine holes 452H may have a substantially circular planar shape. The fine holes 452H may be space apart at equal distance from each other. Accordingly, the fine holes 452H may be arranged with a uniform pitch, and excellent CD uniformity may be obtained.

Figure 27A:
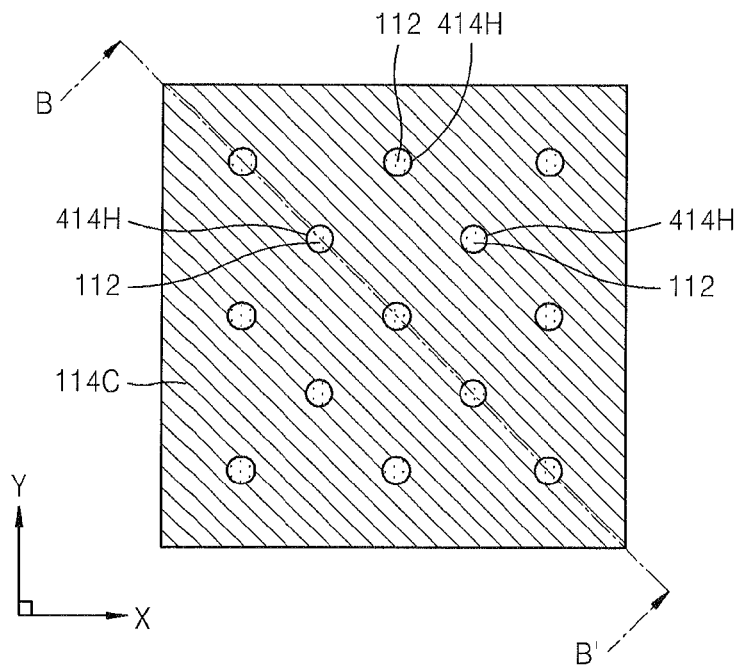
Figure 27B:
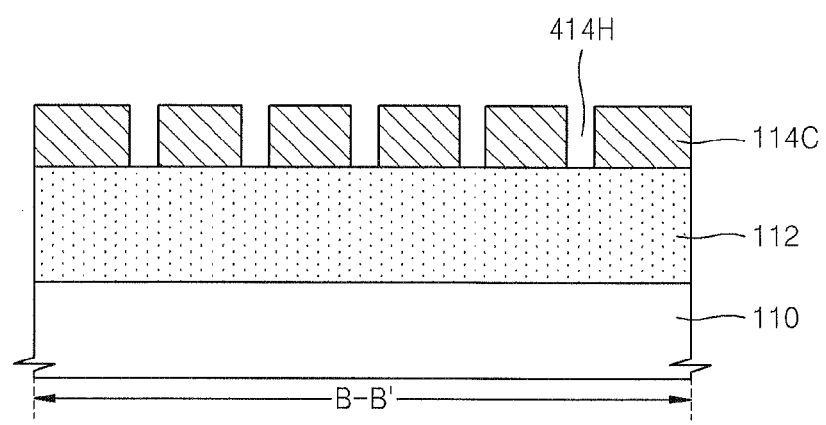

Referring to FIGS. 27A and 27B, the anti-reflective coating film 120 exposed by the surrounding blocks 454 are removed with a method like that described with reference to FIGS. 6A and 6B. The hard mask layer 114 is etched by using the surrounding blocks 454 and the second areas 234 of the photoresist film 130 as an etch mask, thereby forming a hard mask pattern 114C having a plurality of fine holes 414H.

In forming the hard mask pattern 114C, the surrounding blocks 454, the second areas 234 of the photoresist film 130, and the anti-reflective coating film 120 may be removed. In an embodiment, after the fine holes 414H are formed in the hard mask layer 114, the surrounding blocks 454, the second area 234 of the photoresist film 130, and the anti-reflective coating film 354 may be removed by an additional process when they remain on the hard mask pattern 114C.

Figure 28A:
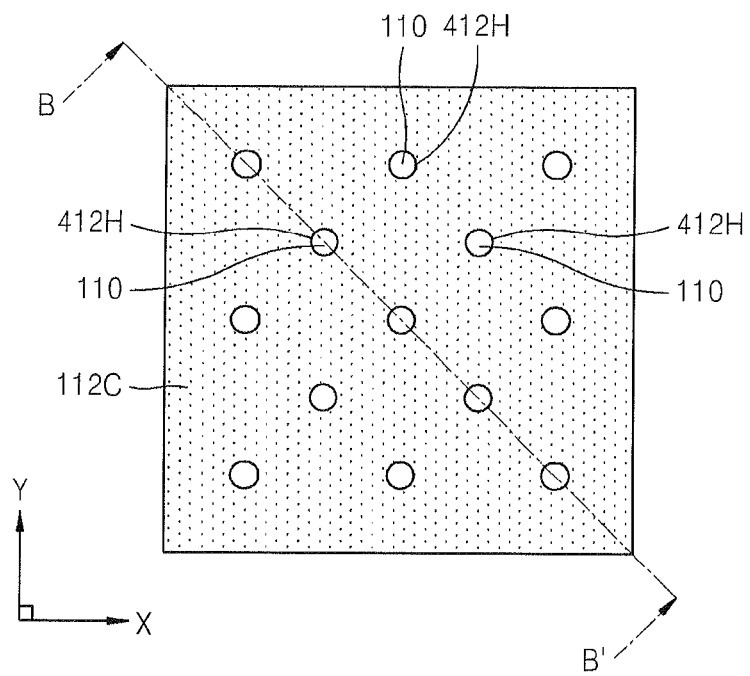
Figure 28B:
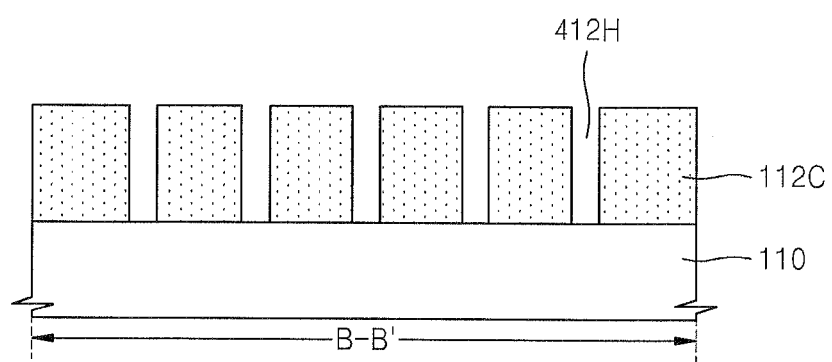

Referring to FIGS. 28A and 28B, the to-be-etched film 112 is etched by using the hard mask pattern 114C of FIGS. 27A and 27B as an etch mask by using a method like that described with reference to FIGS. 8A and 8B, thereby forming a fine pattern 112C having a plurality of fine holes 412H. Thereafter, the hard mask pattern 114C remaining on the fine pattern 112C is removed to expose an upper surface of the fine pattern 112C.

According to a method of forming patterns, according to an embodiment of the present inventive concept, a first exposing operation is performed with a relatively low dose on a photoresist film by using a photomask having a plurality of hole-shape light-transmitting areas, and an exposed area is removed with a positive tone developer to form a plurality of first holes with a relatively low pattern density in the photoresist film. Thereafter, a second exposing operation is performed on the photoresist film having the first holes by using the photomask, and a non-exposed area is removed with a negative tone developer to form a plurality of second holes in an area of the photoresist film which are separated from the first holes. According to a method of forming patterns, according to an embodiment of the present inventive concept, the fine holes are repeatedly arranged with a small pitch, and a honeycomb layout, which is more appropriate for embodying a more reduced pitch compared to a matrix-shaped layout, may be easily embodied. Also, according to a method of forming patterns, according to an embodiment of the present inventive concept, a DSA operation is performed on a result having the first holes and the second holes, and a central block and a surrounding block are self-aligned in a concentric circular shape in the first holes and the second holes, and by removing the central block, a plurality of fine holes, which have sizes smaller than those of the first holes and the second holes, may be formed in the photoresist film. According to a method of forming patterns, according to an embodiment of the present inventive concept, due to the DSA operation, even when the first holes and the second holes have non-uniform pattern profiles or non-uniform CD distribution, since the central block and the surrounding block are self-aligned to be regularly arranged in a concentric circular shape due to a polarity difference of polymer blocks, CD scattering of the resultant fine holes may be improved.

According to a method of forming patterns, according to an embodiment of the present inventive concept, a two exposing operations are performed by using the same photomask, so that minimum pitches between a plurality of patterns formed in a limited area are reduced, thereby increasing a pattern density and improving CD scattering of a plurality of fine holes.

While the present inventive concept has been shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A method of forming patterns comprising the steps of:
    forming a photoresist film on a substrate;
    exposing the photoresist film with a first dose of light to form a first area and a second area in the photoresist film;
    forming a first hole and a second hole by removing the first area and the second area with a first developer;
    exposing the photoresist film with a second dose of light to form a third area in the photoresist film between the first hole and the second hole; and
    forming a third hole between the first hole and the second hole by removing the third area with a second developer.

2. The method of claim 1, wherein the first dose is greater than the second dose.

3. The method of claim 1, wherein the step of exposing the photoresist film with the second dose of the light is performed with a photomask used for performing the step of exposing the photoresist film.

4. The method of claim 3 further comprising the steps of:
    aligning the photomask using an align mark formed on the substrate before the step of exposing the photoresist film; and
    aligning the photomask using the align mark before the step of exposing the photoresist film with the second dose of the light.

5. The method of claim 3, wherein the photomask includes a plurality of hole-shape light-transmitting areas.

6. The method of claim 3, wherein the photomask includes a plurality of diamond shape light-transmitting areas whose vertices meet each other.

7. The method of claim 1 further comprising the steps of:
    forming a film on the substrate;
    forming a hard mask layer between the film and the photoresist film;
    forming an anti-reflective coating film on the hard mask layer;
    patterning the hard mask layer using the photoresist film including the first, the second, and the third holes; and
    etching the film using the patterned hard mask layer as an etch mask.

8. The method of claim 1, wherein the photoresist film comprises a resin having polarity that increases by an acid catalyst.

9. The method of claim 1, wherein the first developer comprises a positive tone developer, and the second developer comprises a negative tone developer.

10. The method of claim 1, further comprising the steps:
    forming a material layer comprising a block copolymer in the first, the second, and the third holes, wherein the block copolymer includes a first polymer block and a second polymer block;
    performing a heat treatment on the substrate to separate the material layer into the first polymer block and the second polymer block and self-aligned into a concentric layered cylinder, wherein the first polymer block is positioned at a center of the first hole and the second polymer block surrounds the first polymer block; and
    removing the first polymer block positioned at the center of the first hole to form a fourth hole.

11. The method of claim 10, wherein the heat treatment is performed at a temperature higher than a glass transition temperature of the block copolymer.

12. The method of claim 10 further comprising a step of performing an Ar plasma surface treatment to the photoresist film including the first, the second, and the third holes before the forming a material layer comprising a block copolymer.

13. The method of claim 10, wherein the first polymer block removed by O2 plasma.

14. The method of claim 10, wherein the fourth hole has a diameter of about 20 nm.

15. The method of claim 1, wherein the first and the second holes have a first diameter, and the third hole has a second diameter greater than the first diameter.

16. A method of manufacturing a semiconductor device comprising the steps of:
    forming a photoresist film on a substrate;
    aligning a photomask including at least two light transmitting areas over the photoresist film;
    irradiating a first dose of light through the photomask to form at least two areas in the photoresist film, wherein each of the at least two areas is positioned below each of at least two light transmitting areas and each of at least two areas is smaller than each of the at least two transmitting areas;
    forming at least two holes by removing the at least two areas from the photoresist film with a first developer;
    aligning the photomask over the photoresist film including the at least two holes;
    irradiating a second dose of light through the photomask to form a third area in the photoresist film, wherein the third area is positioned between the at least two holes in the photoresist film; and
    forming a third hole by removing the third area from the photoresist film with a second developer.

17. The method of claim 16, wherein the photoresist film comprises a resin having polarity that increases by an acid catalyst, and each of the at least two areas includes an amount of the polarity greater than a threshold amount of the polarity to change a property of the photoresist film.

18. The method of claim 17, wherein the third area include an amount of the polarity less than the threshold amount of the polarity.

19. The method of claim 16 further comprising the steps of:
    performing an Ar plasma surface treatment to the photoresist film including the first, the second, and the third holes;
    forming a material layer comprising a block copolymer in the at least two and the third holes, wherein the block copolymer includes a first polymer block and a second polymer block;
    performing a heat treatment to the substrate to separate the material layer into the first polymer block and the second polymer block and self-aligned into a concentric layered cylinder, wherein the first polymer block is positioned at a center of the first hole and the second polymer block surrounds the first polymer block; and
    removing the first polymer block positioned at the center of the first hole to form a fourth hole.

20. The method of claim 19, wherein the first polymer block is removed by O2 plasma.

* * * * *

UNITED STATES PATENT AND TRADEMARK OFFICE
CERTIFICATE OF CORRECTION

PATENT NO.         : 8,986,554 B2                                          Page 1 of 1
APPLICATION NO.    : 13/719995
DATED              : March 24, 2015
INVENTOR(S)        : Kim et al.

It is certified that error appears in the above-identified patent and that said Letters Patent is hereby corrected as shown below:

On the title page item (72)

Change "Shi-young Yi" to -- SHI YONG YI --.

Signed and Sealed this
Twenty-second Day of March, 2016

Michelle K. Lee
*Director of the United States Patent and Trademark Office*